(12) United States Patent
Maruyama

(10) Patent No.: US 9,029,960 B2
(45) Date of Patent: May 12, 2015

(54) SEMICONDUCTOR DEVICE AND METHOD OF MANUFACTURING THE SAME

(71) Applicant: DENSO CORPORATION, Kariya, Aichi-pref. (JP)

(72) Inventor: Yumi Maruyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/850,404

(22) Filed: Mar. 26, 2013

(65) Prior Publication Data

US 2013/0256813 A1    Oct. 3, 2013

(30) Foreign Application Priority Data

Mar. 27, 2012  (JP) ................................. 2012-071704
Nov. 9, 2012  (JP) ................................. 2012-247660

(51) Int. Cl.
H01L 27/14    (2006.01)
H01L 29/00    (2006.01)
H01L 23/49    (2006.01)
H01L 23/00    (2006.01)
B81C 1/00    (2006.01)

(52) U.S. Cl.
CPC ............. *H01L 24/09* (2013.01); *H01L 24/03* (2013.01); *B81C 1/00269* (2013.01); *B81C 2203/019* (2013.01)

(58) Field of Classification Search
CPC ......... H01L 24/09; H01L 24/03; H01L 29/00; H01L 29/84; H01L 23/49; H01L 27/14
USPC ............ 257/414–41, 414–418, 684, E21.002, 257/E23.18, E21.499, E21.532; 438/406, 438/48, 4, 50–55, 106
See application file for complete search history.

(56) References Cited

U.S. PATENT DOCUMENTS 5,223,450 A   6/1993  Fujino et al.
5,756,901 A   5/1998  Kurle et al.
6,268,232 B1  7/2001  Skapa et al.

(Continued)

FOREIGN PATENT DOCUMENTS

JP    10-303088 A    11/1998
JP    2010-224176 A   10/2010

OTHER PUBLICATIONS

T. Suni et al. "Silicon-on-Insulator Wafers with Buried Cavities." Journal of the Electrochemical Society, vol. 153 (4). Feb. 22, 2006. pp. G299-G303.

(Continued)

*Primary Examiner* — Amar Movva
*Assistant Examiner* — Sheikh Maruf
(74) *Attorney, Agent, or Firm* — Posz Law Group, PLC

(57) ABSTRACT

The semiconductor device has a sensor unit including a sensing part, and a semiconductor substrate. The semiconductor substrate is bonded to the sensor unit through an insulation film such that the sensing part is disposed in an air-tightly sealed chamber provided between a recessed portion of the semiconductor substrate and the sensor unit. A surface of the semiconductor substrate provided on a periphery of the recessed portion includes a boundary region at a perimeter of the recessed portion and a bonding region on a periphery of the boundary region. The bonding region has an area greater than an area of the boundary region. The bonding region of the semiconductor substrate is bonded to the sensor unit through the insulation film.

5 Claims, 18 Drawing Sheets

(56) References Cited

U.S. PATENT DOCUMENTS

| | | |
|---|---|---|
| 2007/0222011 A1* | 9/2007 | Robert et al. ............... 257/415 |
| 2008/0194053 A1* | 8/2008 | Huang ........................ 438/53 |
| 2008/0290490 A1* | 11/2008 | Fujii et al. .................. 257/684 |
| 2009/0008728 A1* | 1/2009 | Fujii et al. .................. 257/415 |
| 2009/0159997 A1 | 6/2009 | Okudo et al. |
| 2009/0261430 A1* | 10/2009 | Suzuki et al. ............... 257/417 |
| 2010/0044808 A1* | 2/2010 | Dekker et al. .............. 257/415 |
| 2010/0155865 A1* | 6/2010 | Sugiura et al. ............. 257/417 |
| 2010/0176466 A1* | 7/2010 | Fujii et al. .................. 257/415 |
| 2010/0218977 A1 | 9/2010 | Inoue et al. |
| 2010/0252898 A1* | 10/2010 | Tanaka et al. .............. 257/415 |
| 2011/0147863 A1* | 6/2011 | Fujii et al. .................. 257/418 |

OTHER PUBLICATIONS

Office Action mailed Apr. 8, 2014 issued in corresponding JP patent application No. 2012-247660 (and English translation).
Office Action mailed Nov. 18, 2014 issued in corresponding JP patent application No. 2012-247660 (and English translation).

* cited by examiner

SEMICONDUCTOR DEVICE AND METHOD OF MANUFACTURING THE SAME

CROSS REFERENCE TO RELATED APPLICATIONS

This application is based on Japanese Patent Applications No. 2012-71704 filed on Mar. 27, 2012 and No. 2012-247660 filed on Nov. 9, 2012, the disclosures of which are incorporated herein by reference.

TECHNICAL FIELD

The present disclosure relates to a semiconductor device including a semiconductor substrate and a sensor unit bonded to the semiconductor substrate through an insulation film, and a method of manufacturing the semiconductor device.

BACKGROUND

Conventionally, a semiconductor device including a semiconductor substrate and a sensor unit bonded to the semiconductor substrate through an insulation film has been known, for example as described in a patent literature 1. In the semiconductor device, the sensor unit is provided with a sensing part. The sensor unit is bonded to the semiconductor substrate such that the sensing part is sealed between the sensor unit and the semiconductor substrate.

In such a semiconductor device, the semiconductor substrate is formed with a recessed portion at a position corresponding to the sensing part so as to restrict the sensing part from contacting the semiconductor substrate. The insulation film is disposed between the sensor unit and the semiconductor substrate to provide electric insulation between the sensor unit and the semiconductor substrate.

The semiconductor device is, for example, produced in a following manner.

First, a first semiconductor wafer is prepared. The sensing part is formed in each of chip formation regions of the first semiconductor wafer, the chip formation region providing the sensor unit when the first semiconductor wafer is divided into chips. Also, a second semiconductor wafer, which provides semiconductor substrates when being divided into chips, is prepared. The recessed portion is formed in the second semiconductor wafer at a position corresponding to each of the sensing parts. Then, the second semiconductor wafer is thermally oxidized such that a thermal oxide film is formed on a surface of the second semiconductor wafer, which is to be opposed to the first semiconductor wafer.

Further, the first semiconductor wafer and the second semiconductor wafer are stacked such that the first semiconductor wafer is boned to the thermal oxide film of the second semiconductor wafer. Thus, a stacked wafer is produced. Then, the stacked wafer is divided into chips. The semiconductor device is provided by the chip.

In the method described above, the thermal oxide film is formed after the recessed portion is formed in the second semiconductor wafer. Therefore, the oxidation is accelerated at a position adjacent to the opening perimeter of the recessed portion due to stress being concentrated. As a result, a thickness of the thermal oxide film is increased at the position adjacent to the opening perimeter of the recessed portion than a remaining portion, such as a region on a periphery of the opening perimeter (e.g., see a non-patent literature 1). In other words, the thermal oxide film is formed as it rises at the position adjacent to the opening perimeter of the recessed portion.

If the first semiconductor wafer is bonded to the second semiconductor wafer through this thermal oxide film, only the portions of the thermal oxide film adjacent to the opening perimeters of the recessed portions are bonded to the first semiconductor wafer. That is, only the risen portions of the thermal oxide film are bonded to the first semiconductor wafer. As a result, a bonding property between the thermal oxide film (second semiconductor wafer) and the first semiconductor wafer is insufficient. Namely, when the stacked wafer is divided into the chips, the bonding property between the sensor unit and the semiconductor substrate is insufficient.

<Patent Literature 1>
Japanese Patent Application Publication No. 2011-199301
<Non-Patent Literature 1>
T. Suni, K. Henttinen, J. Dekker, H. Luoto, M. Kulawski, J. Makinen, and R. Mutikainen, "Silicon-on-Insulator Wafers with Buried Cavities", Journal of The Electrochemical Society, 153 (4) G299-G303 (2006)

SUMMARY

The inventor of the present disclosure conducted a tension test for the semiconductor device produced by the above described manufacturing method. As a result, it was confirmed that the sensor unit is bonded with the thermal oxide film only at the position adjacent to the opening perimeter of the recessed portion where the thickness of the thermal oxide film is increased.

To address the issue, for example, it is considered to flatten the thermal oxide film after the thermal oxide film is formed. In this case, however, particles adhere to the thermal oxide film, resulting poor bonding and an abnormality in sensor characteristics.

Also, it is considered to form the sensing part in the first semiconductor wafer at a position recessed from the surface opposing to the second semiconductor wafer by a special etching process. In this case, the sensing part is restricted from contacting the second semiconductor wafer, even if the recessed portion is not formed in the second semiconductor wafer. Therefore, it is not necessary to form the recessed portion in the second semiconductor wafer. Namely, the first semiconductor wafer is entirely bonded to the thermal oxide film formed on the surface of the second semiconductor wafer.

In regard to the above method, however, if the sensing part includes a comb-shaped movable electrode a comb-shaped fixed electrode, the comb-shape is likely to be uneven. Therefore, an abnormality of the sensor characteristics is concerned.

The present disclosure is made in view of the foregoing matters, and it is an object of the present disclosure to provide a semiconductor device that is capable of improving a bonding property between a sensor unit and a semiconductor substrate while reducing an abnormality in sensor characteristic, and a method of manufacturing the semiconductor device.

According to an aspect of the present disclosure, a semiconductor device includes a sensor unit, a semiconductor substrate, and an insulation film. The sensor unit has a sensing part, which outputs a sensor signal according to a physical quantity, adjacent to a surface of the sensor unit. The semiconductor substrate has a recessed portion recessed from a surface of the semiconductor substrate at a region opposing to the sensing part. The insulation film is disposed between the surface of the sensor unit and the surface of the semiconductor substrate. The sensor unit and the semiconductor substrate are stacked such that an air-tightly sealed chamber is provided between the sensor unit and the recessed portion of the semiconductor substrate and the sensing part is disposed in the air-tightly sealed chamber. The surface of the semiconductor substrate, which is provided on a periphery of the recessed portion, includes a boundary region at a perimeter of the recessed portion and a bonding region on a periphery of the boundary region. The bonding region has an area greater than an area of the boundary region. The bonding region of the surface of the semiconductor substrate is bonded to the sensor unit through the insulation film.

In the semiconductor device described above, the bonding region, which has the area greater than the boundary region, is bonded to the sensor unit through the insulation film. Therefore, a bonding area between the sensor unit and the semiconductor substrate is increased, and hence a bonding property of the semiconductor device improves. Since the semiconductor substrate has the recessed portion, the sensing part having a general structure can be used and an abnormality of sensor characteristic is reduced.

According to an aspect of a method of manufacturing a semiconductor device, a sensing part is formed in each of chip formation regions of a first semiconductor wafer, the chip formation region providing a sensor unit when the first semiconductor wafer is divided into chips. A recessed portion is formed in a surface of each of opposing regions of a second semiconductor wafer, the opposing region providing a semiconductor substrate when the second semiconductor wafer is divided into chips. An insulation film is formed on a peripheral region of the recessed portion in the surface of the second semiconductor wafer, such that a thickness of a portion of the insulation film formed on a bonding region is greater than a thickness of a portion of the insulation film formed on a boundary region. The boundary region is a part of the peripheral region and defined at a perimeter of the recessed portion. The bonding region being a part of the peripheral region and defined on a periphery of the boundary region. The bonding region has an area greater than an area of the boundary region. Further, the first semiconductor wafer and the second semiconductor wafer are bonded such that the sensing part is disposed in an air-tightly sealed chamber provided between the first semiconductor wafer and the recessed portion of the second semiconductor wafer, and the first semiconductor wafer and the portion of the insulation film formed on the bonding region are bonded to each other. Then, the bonded first semiconductor wafer and second semiconductor wafer are divided into chips.

In the method described above, the insulation film is formed on the peripheral region of the recessed portion in the surface of the opposing region of the second semiconductor wafer, such that the thickness of the portion of the insulation film formed on the bonding region is greater than the thickness of the portion of the insulation film formed on the boundary region. The first semiconductor wafer is bonded to the insulation film formed on the bonding region. Therefore, a bonding area between the first semiconductor substrate and the insulation film is increased, and thus a bonding property improves. Namely, in each of the chips, the bonding property between the sensor unit and the semiconductor substrate improves. In this case, because it is not necessary to flatten the insulation film, poor bonding and an abnormality of sensor characteristic are reduced. Since the recessed portion is formed in the second semiconductor wafer, the sensing part having a general structure can be used and an abnormality of sensor characteristic is reduced.

According to another aspect of a method of a semiconductor device, a sensing part is formed in each of chip formation regions of a first semiconductor wafer, the chip formation region providing a sensor unit when the first semiconductor wafer is divided into chips. A recessed portion is formed in a surface of each of opposing regions of a second semiconductor wafer, the opposing region providing a semiconductor substrate when the second semiconductor wafer is divided into chips. An insulation film is formed only on a bonding region of a peripheral region in the surface of the second semiconductor wafer. The peripheral region is provided on a periphery of the recessed portion in the surface of the second semiconductor wafer. The peripheral region includes a boundary region at a perimeter of the recessed portion and the bonding region on a periphery of the boundary region. The bonding region has an area greater than an area of the boundary region. Further, the first semiconductor wafer and the second semiconductor wafer are bonded such that the sensing part is disposed in an air-tightly sealed chamber provided between the first semiconductor wafer and the recessed portion of the second semiconductor wafer, and the first semiconductor wafer and the insulation film formed on the bonding region are bonded to each other. Then, the bonded first semiconductor wafer and second semiconductor wafer are divided into chips.

In the method described above, the insulation film is formed only on the bonding region in the peripheral region of the surface of the second semiconductor wafer, and the first semiconductor wafer is bonded to the insulation film formed on the bonding region. Therefore, a bonding area between the first semiconductor substrate and the insulation film is increased, and thus a bonding property improves. Namely, in each of the chips, the bonding property between the sensor unit and the semiconductor substrate improves. In this case, because it is not necessary to flatten the insulation film, poor bonding and an abnormality of sensor characteristic are reduced. Since the recessed portion is formed in the second semiconductor wafer, the sensing part having a general structure can be used and an abnormality of sensor characteristic is reduced.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Figure 1:
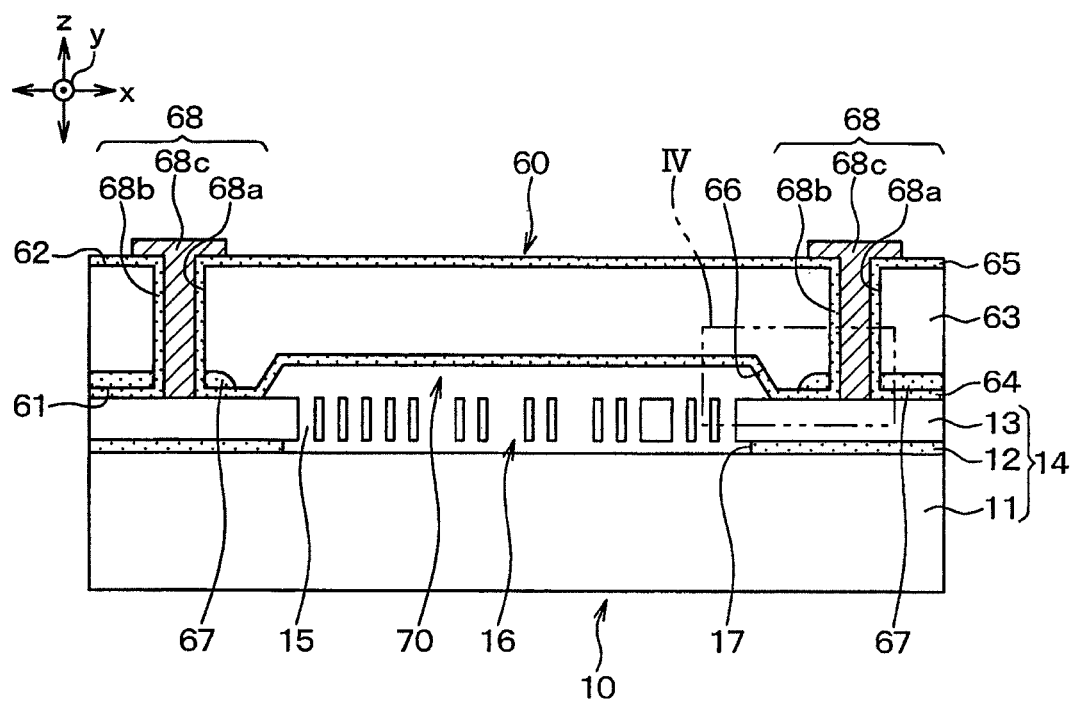
FIG. 1 is a schematic cross-sectional view of a semiconductor device according to a first embodiment of the present disclosure.

Hereinafter, embodiments of the present disclosure will be described with reference to the drawings. Throughout the embodiments, like parts will be designated with like reference numerals, and descriptions thereof will not be repeated. In the drawings illustrating cross-sections of the semiconductor device, hatchings are partly provided for the purpose of clarity.

(First Embodiment)

A first embodiment will be described with reference to FIGS. 1 to 8B.

A semiconductor device described hereinafter is, for example, a physical quantity sensor, such as an acceleration sensor, having a movable element. For example, the semiconductor device is used to detect an acceleration of a vehicle and the like.

Referring to FIG. 1, the semiconductor device includes a sensor unit 10 and a cap unit 60. The cap unit 60 is bonded to the sensor unit 10. First, a structure of the sensor unit 10 will be described.

The sensor unit 10 includes a SOI (silicon on insulator) substrate 14. The SOI substrate 14 includes a support substrate 11, an embedded insulation film 12 disposed on the support substrate 11, and a semiconductor layer 13 disposed opposite to the support substrate 11 with respect to the embedded insulation film 12. Further, the SOI substrate 14 is processed by a well-known micromachining technique. A surface of the semiconductor layer 13 opposite to the embedded insulation film 12 provides a first surface of the sensor unit 10.

Figure 2:
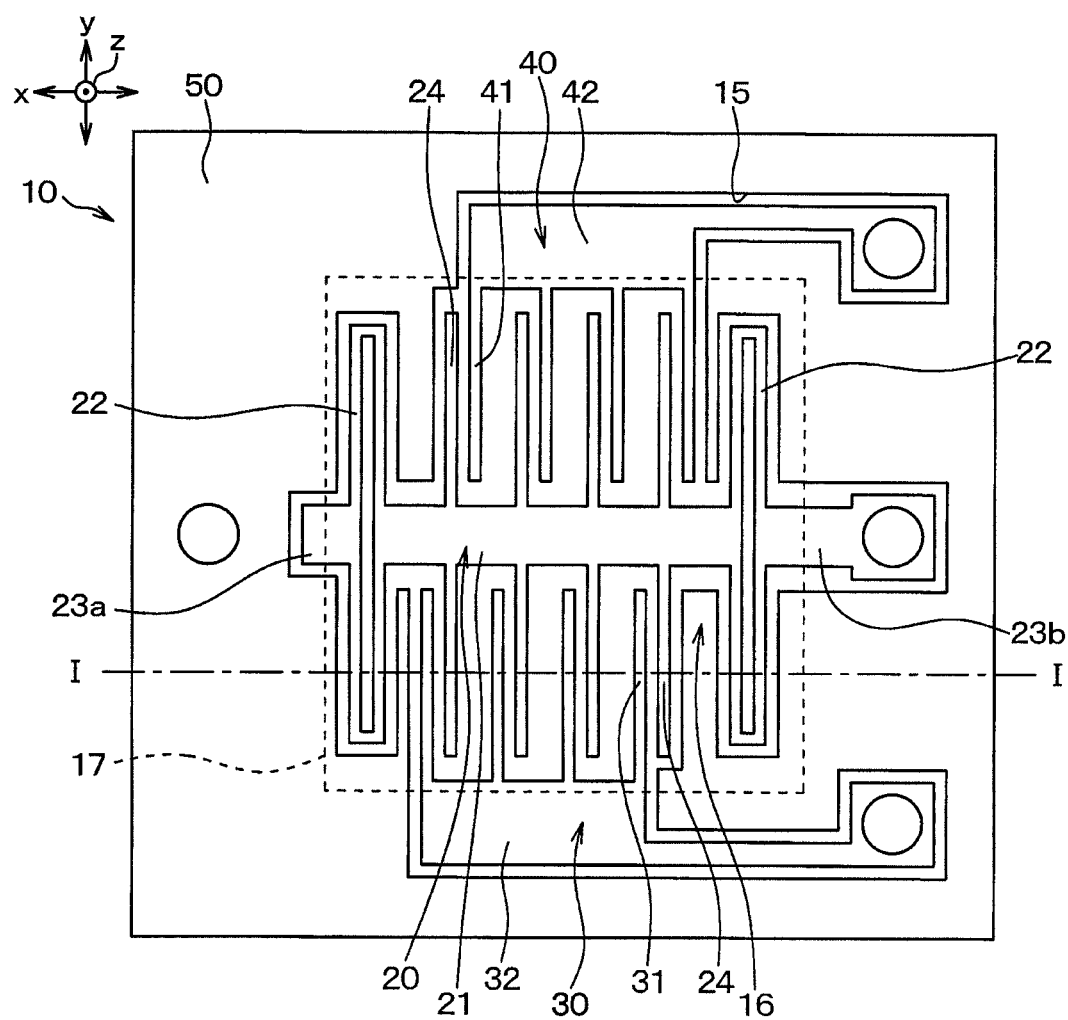
FIG. 2 is a plan view of a sensor unit of the semiconductor device shown in FIG. 1.

As shown in FIGS. 1 and 2, the semiconductor layer 13 is formed with a sensing part 16. In particular, a groove 15 is formed in the semiconductor layer 13 such that a comb-shaped beam structure is formed. The comb-shaped beam structure includes a movable part 20 and fixed parts 30, 40. The sensing part 16 outputs a sensor signal according to an acceleration by means of the beam structure.

The embedded insulation film 12 is formed with an opening 17 at a position corresponding to a region where the beam structure is formed. The opening 17 has a rectangular shape. The opening 17 is formed by removing a portion of the embedded insulation film 12 by a sacrifice layer etching technique.

FIG. 2 is a diagram illustrating a plan view of the sensor unit 10 when the sensor unit 10 is viewed from the top of FIG. 1. The sensor unit 10 shown in FIG. 1 corresponds to a schematic cross-sectional view taken along a line I-I in FIG. 2.

As shown in FIG. 2, the movable part 20 is disposed to extend through and above the opening 17. The movable part 20 includes a rectangular weight portion 21, beam portions 22, and anchor portions 23a, 23b. Longitudinal ends of the weight portion 21 integrally connect to the anchor portions 23a, 23b through the beam portions 22. The anchor portions 23a, 23b are fixed at the rim portions of the opening 17 of the embedded insulation film 12, and are supported by the support substrate 11. Therefore, the weight portion 21 and the beam portions 22 face the opening 17.

Directions along X-, Y- and Z-axes in FIGS. 1 and 2 will be described.

As shown in FIGS. 1 and 2, a direction along an X-axis will be referred to as an X-axis direction, and a direction along a Y-axis will be referred to as a Y-axis direction. Also, a direction along a Z-axis will be referred to as a Z-axis direction. In FIGS. 1 and 2, the X-axis direction corresponds to a longitudinal direction of the weight portion 21. The Y-axis direction corresponds to a direction parallel to a plane direction of the SOI substrate 14 and perpendicular to the X-axis direction. The Z-axis direction corresponds to a direction perpendicular to the plane direction of the SOI substrate 14.

The beam portion 22 has a rectangular frame shape in which parallel two beams are connected at both ends. The beam portion 22 serves as a spring that moves in directions perpendicular to the longitudinal direction of the two beams. In particular, when an acceleration containing a component parallel to the X-axis occurs, the beam portions 22 allow the weight portion 21 to move in a direction parallel to the X-axis. When the acceleration disappears, the beam portions 22 restore the weight portion 21 to the original state. Therefore, the weight portion 21, which is connected to the support substrate 11 through the beam portions 22, can move above the opening 17, in a direction that the beam portions 22 move according to the acceleration applied.

The movable part 20 further includes movable electrodes 24. The movable electrodes 24 project from opposite lengthwise edges of the weight portion 21 and extend perpendicular to the longitudinal direction of the weight portion 21, that is, in opposite directions along the Y-axis.

In FIG. 2, four movable electrodes 24 project from a left section of the weight portion 21, and four movable electrodes 24 project from a right section of the weight portion 21. The movable electrodes 24 face the opening 17. The movable electrodes 24 are integral with the weight portion 21, and the weight portion 21 is integral with the beam portions 22. Thus, the movable electrodes 24 are movable with the weight portion 21 in directions parallel to the X-axis when the beam portions 22 move.

The fixed parts 30, 40 are supported at opposite sides of the rim portion of the opening 17 of the embedded insulation film 12 where the anchor portions 23a, 23b are not supported. The two fixed parts 30, 40 are located on opposite sides of the weight portion 21. In FIG. 2, the fixed part 30 is disposed below the weight portion 21, and the fixed part 40 is disposed above the weight portion 21. The two fixed parts 30, 40 are electrically isolated from each other.

Each of the fixed parts 30, 40 includes fixed electrodes 31, 41 (e.g., four fixed electrodes), and a wiring portion 32, 42. The four fixed electrodes 31, 41 are disposed to be opposed to and parallel to the movable electrodes 24 across a predetermined detection interval from a side surface of the opposing movable electrodes 24. The wiring portion 32, 42 is fixed at the rim of the opening 17 and is supported by the support substrate 11.

An end of each of the fixed electrodes 31, 41 is supported by the wiring portion 32. The fixed electrodes 31, 41 extend from the wiring portion 32, 42 in the comb shape. The fixed electrodes 31, 41 are arranged to be meshed in spaces defined between the movable electrodes 24. The fixed electrodes 31, 41 face the opening 17.

The semiconductor layer 13 has a peripheral portion 50 on a periphery of the groove 15. The peripheral portion 50 is arranged on a periphery of the movable electrode 24 and the fixed electrodes 31, 41 across the groove 15.

In other words, the movable part 20 and the fixed parts 30, 40 are located inside of the peripheral portion 50. The peripheral portion 50 is fixed to and supported by the support substrate 11 through the embedded insulation film 12.

Next, the cap unit 60 will be described.

The cap unit 60 restricts entry or adhesion of water and foreign materials to the sensing part 16. Also, the cap unit 60 serves to provide a sealed space between the cap unit 60 and the sensor unit 10.

Figure 3:
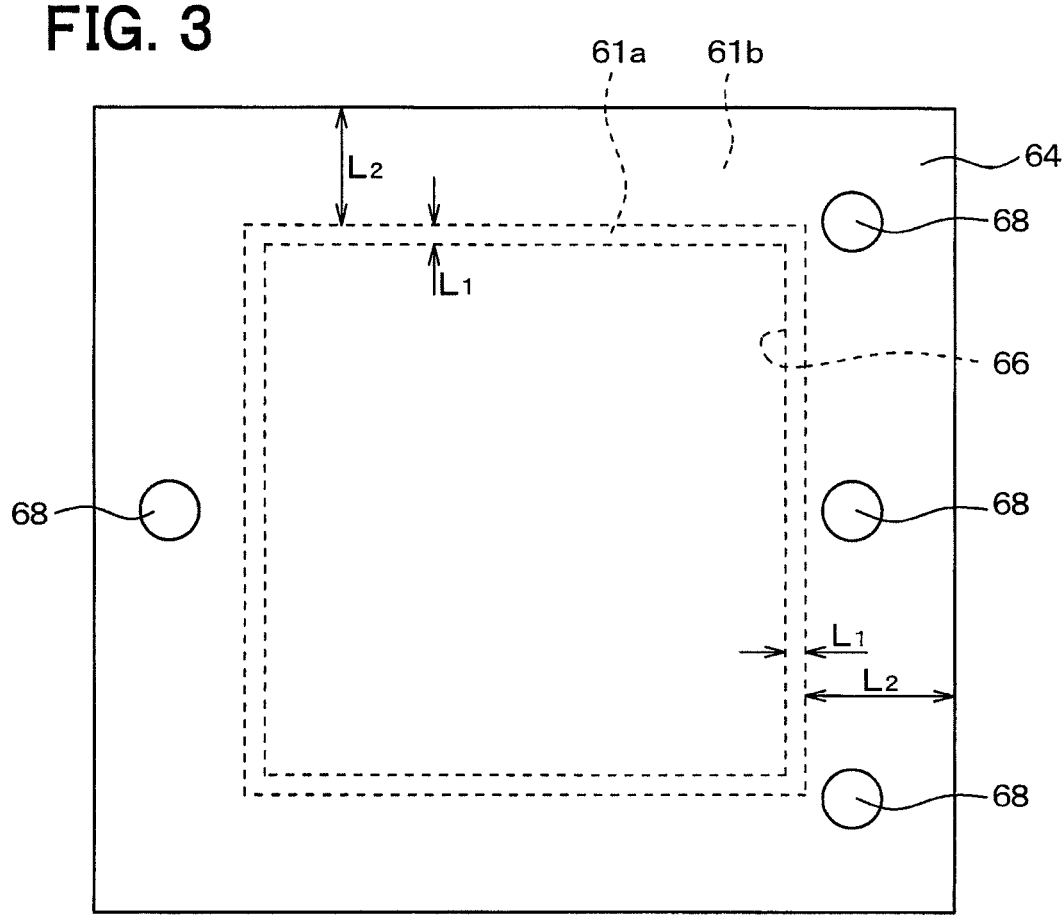
FIG. 3 is a plan view of a cap unit of the semiconductor device shown in FIG. 1.

As shown in FIGS. 1 and 3, the cap unit 60 includes a semiconductor substrate 63, an insulation film 64 and an insulation film 65. The semiconductor substrate 63 has a first surface 61 and a second surface 62. For example, the semiconductor substrate 63 is an N-type silicon substrate in which the first surface 61 defines a (100) surface. However, the semiconductor substrate 63 is not limited to a specific one. FIG. 3 is a plan view of the cap unit 60 when viewed from the bottom side in FIG. 1, that is, from a side adjacent to the sensor unit 10.

The semiconductor substrate 63 is formed with a recessed portion 66 on the first surface 61 at a position corresponding to the sensing part 16. The recessed portion 66 is formed to restrict the sensing part 16 from contacting the cap unit 60. The recessed portion 66 provides a rectangular-shaped opening on the first surface 61. The perimeter edge of the opening of the recessed portion 66 has an angulated shape.

The insulation film 64 is formed entirely over the first surface 61 of the semiconductor substrate 63. Further, the insulation film 64 is formed over the surface of the recessed portion 66. The insulation film 64 is provided to insulate the semiconductor substrate 63 from the sensor unit 10. Since the insulation film 64 is formed over the surface of the recessed portion 66, even if the sensing part 16 (movable part 20) is moved in a direction along the Z-axis, the sensing part 16 is still insulated from the semiconductor substrate 63. That is, in the present embodiment, since the insulation film 64 is formed also on the surface of the recessed portion 66, current leakage is reduced.

The insulation film 64 of the present embodiment will be described hereinafter.

Figure 4:
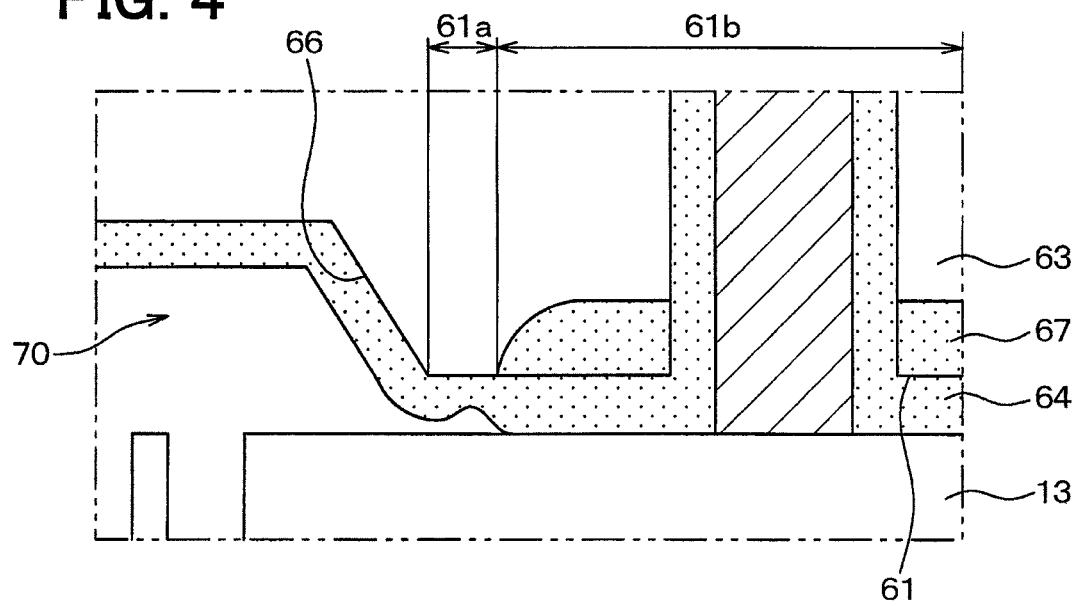
FIG. 4 is an enlarged schematic cross-sectional view of a part IV of the semiconductor device shown in FIG. 1.

The insulation film 64 is a thermal oxide film made by a wet oxidation technique, which will be described later. As shown in FIG. 4, the insulation film 64 has a greater thickness at a position corresponding to a bonding region 61b than that at a position corresponding to a boundary region 61a. Namely, the insulation film 64 has ununiform thickness such that a thickness of a portion of the insulation film 64 formed on the bonding region 61b is greater than a thickness of a portion of the insulation film 64 formed on the boundary region 61a.

The boundary region 61a is provided at a perimeter of the recessed portion 66 in the first surface 61a of the semiconductor substrate 63. In other words, the boundary region 61a is provided by a region defining a boundary between the recessed portion 66 and a peripheral region on a periphery of the recessed portion 66, in the first surface 61 of the semiconductor substrate 63. The bonding region 61b is provided on the periphery of the boundary region 61a in the first surface 61 of the semiconductor substrate 63.

The peripheral region of the first surface 61 of the semiconductor substrate 63 is a region where the recessed portion 66 is not formed in the first surface 61. The boundary region 61a is a region adjacent to the recessed portion 66 in the first surface 61 of the semiconductor substrate 63, as shown in FIGS. 3 and 4. Further, the boundary region 61a is a region at which a stress is likely to concentrate when the first surface 61 of the semiconductor substrate 63 is applied with heat. Furthermore, the boundary region 61a is a region where the thickness of the thermal oxide film is greater than the other region (i.e., bonding region 61b) due to the stress concentrating if the semiconductor substrate 63 is simply thermally oxidized.

The bonding region 61b is a region excluding the recessed portion 66 and the boundary region 61a, in the first surface 61a of the semiconductor substrate 63. In other words, the peripheral region of the first surface 61 provided on the periphery of the recessed portion 66 is composed of the boundary region 61a and the bonding region 61b.

An area of the bonding region 61b is greater than an area of the boundary region 61a. For example, a width L1 of the boundary region 61a in a plane direction of the first surface 61, such as a dimension of the boundary region 61a in an up and down direction in FIG. 3, is approximately 3 micrometers (μm). A width L2 of the bonding region 61b in the plane direction of the first surface 61, such as a dimension of the bonding region 61b in the up and down direction in FIG. 3, is approximately 100 μm. However, the width L1 and the width L2 are not limited to these dimensions.

The insulation film 65 is disposed along the second surface 62 of the semiconductor substrate 63, and is opposite to the insulation film 64.

An impurity layer 67 is formed in a surface layer portion of the semiconductor substrate 63, the surface layer portion defining the first surface 61. The impurity layer 67 is formed in the surface layer portion at a location corresponding to the bonding region 61b. The impurity layer 67 is, for example, made of boron, phosphorous, arsenic, argon, xenon, and the like.

The cap unit 60 has four penetrating electrodes 68. The penetrating electrodes 68 pass through the cap unit 60 in a stacking direction in which the sensor unit 10 and the cap unit 60 are stacked. In FIG. 1, the stacking direction corresponds to an up and down direction.

Each of the penetrating electrodes 68 is provided by a through hole 68a, an insulation film 68b, and a penetrating electrode portion 68c. The through hole 68a passes through the insulation film 65, the semiconductor substrate 63 and the insulation film 64. The insulation film 68b is formed on a surface defining the through hole 68a. The penetrating electrode portion 68c is embedded on the insulation film 68b.

A first end (e.g., lower end in FIG. 1) of the penetrating electrode portion 68c is coupled to the anchor portion 23b or the like. In particular, a first end of one of the four penetrating electrodes 68 is electrically coupled to the anchor portion 23b. First ends of other two of the four penetrating electrodes 68 are electrically coupled to the wiring portions 32, 42. A first end of a remaining one of the four penetrating electrodes 68 is electrically coupled to the peripheral portion 50. A second end of each of the penetrating electrode portions 68c is patterned into a pad shape.

In the present embodiment, for example, the through hole 68a has a cylindrical shape. The insulation film 68b is, for example, made of an insulation material such as tetraethoxysilane (TEOS). The penetrating electrode portion 68c is, for example, made of aluminum (Al).

The cap unit 60 has the structure described hereinabove. As shown in FIG. 1, the sensor unit 10 and the cap unit 60 are bonded and integrated to each other. In particular, the semiconductor substrate 63 is bonded to the sensor unit 10 through the insulation film 64.

In the present embodiment, the sensor unit 10 and the cap unit 60 are bonded to each other in such a manner that the semiconductor layer 13 of the sensor unit 10 and the insulation film 64 of the cap unit 60 are directly bonded to each other. More particular, as shown in FIG. 4, the portion of the insulation film 64 formed on the bonding region 61b of the first surface 61 is directly bonded to the semiconductor layer 13 of the sensor unit 10.

Since the sensor unit 10 and the cap unit 60 are stacked and bonded in the manner described above, an air-tightly sealed chamber 70 is provided between the sensor unit 10 and the recessed portion 66 of the cap unit 60. The sealed chamber 70 is air-tightly sealed, and the sensing part 16 is disposed in the sealed chamber 70. The sealed chamber 70 is, for example, in a vacuum condition.

Next, a manufacturing method of the above-described semiconductor device will be described with reference to FIGS. 5A to 5C, 6A to 6E and 7A to 7D. In an actual manufacturing method, wafer substrates are used. In FIGS. 5A to 7D, however, only portion of the wafer substrates for one chip are illustrated for the sake of convenience. First, a manufacturing method of the sensor unit 10 will be described.

Figure 5A:
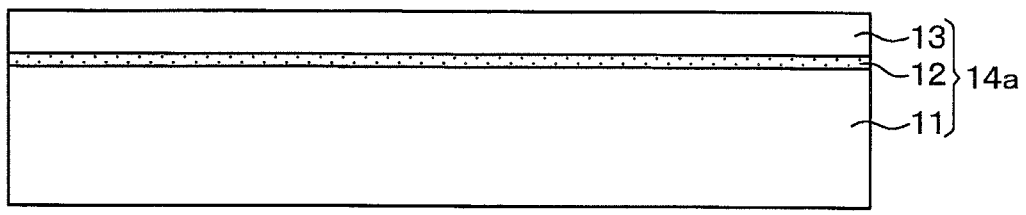
FIGS. 5A to 5C are schematic cross-sectional views for illustrating a manufacturing process of the sensor unit according to the first embodiment.

As shown in FIG. 5A, a SOI wafer 14a, which provides the sensor units 10, is prepared. In the present embodiment, the SOI wafer 14a corresponds to a first semiconductor wafer. The SOI wafer 14a includes the support substrate 11, the embedded insulation film 12 and the semiconductor layer 13.

Figure 5B:
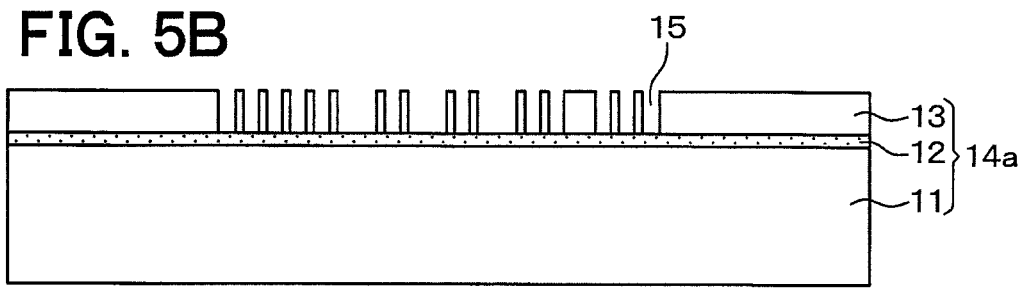

As shown in FIG. 5B, a mask (not shown), such as a resist or an oxide film, is formed on the semiconductor layer 13, and is patterned such that an opening is formed at a position corresponding to the groove 15. Then, the semiconductor layer 13 is etched by a reactive iron etching (RIE) technique or the like, such that the groove 15 is formed in the semiconductor layer 13. Thereafter, the mask is removed.

Figure 5C:
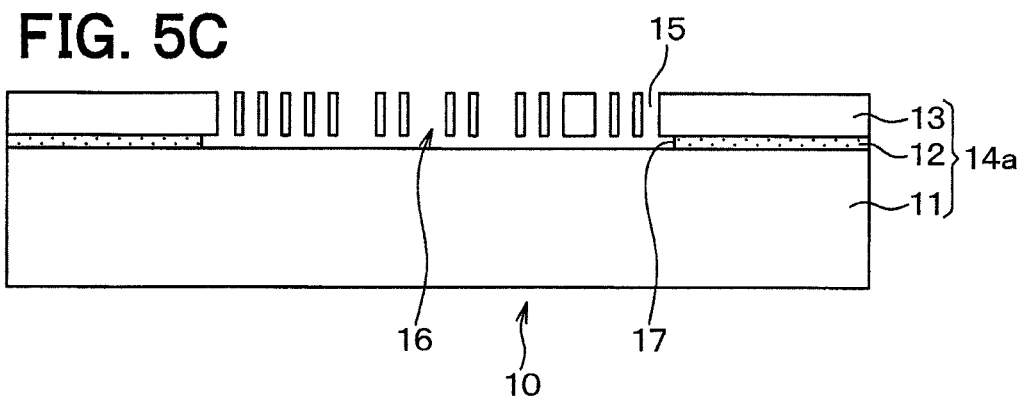

As shown in FIG. 5C, the embedded insulation film 12 exposing from the groove 15 of the semiconductor layer 13 is removed by a sacrifice layer etching technique or the like. As a result, the weight portion 21, the beam portions 22, the movable electrodes 24, and the fixed electrodes 31, 41 are released from the support substrate 11. As such, the sensing part 16 is formed. In this way, the SOI wafer 14a having the sensor units 10 is produced.

Next, a manufacturing method of the cap unit 60 will be described.

Figure 6A:
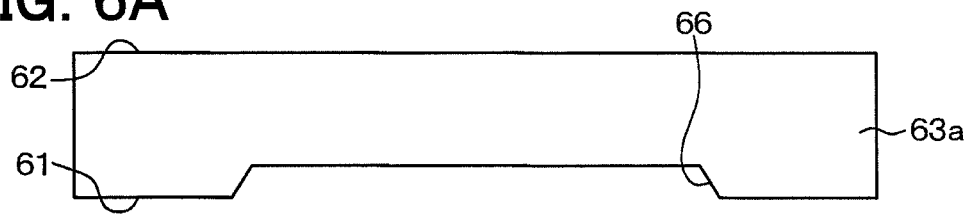
FIGS. 6A to 6E are schematic cross-sectional views for illustrating a manufacturing process of the cap unit according to the first embodiment.

As shown in FIG. 6A, a semiconductor wafer 63a, which provides the cap units 60, is prepared. The semiconductor wafer 63a has the same size as the SOI wafer 14a. A first surface 61 of the semiconductor wafer 63a is etched to form the recessed portion 66 at a position corresponding to the sensing part 16 of the SOI wafer 14a. The recessed portion 66 has a depth approximately 5 μm to 10 μm.

The recessed portion 66 may be formed by any etching technique. For example, the recessed portion 66 may be formed by a lithography technique, an RIE technique, or an alkali etching technique. The semiconductor wafer 63a corresponds to a second semiconductor wafer.

Figure 6B:
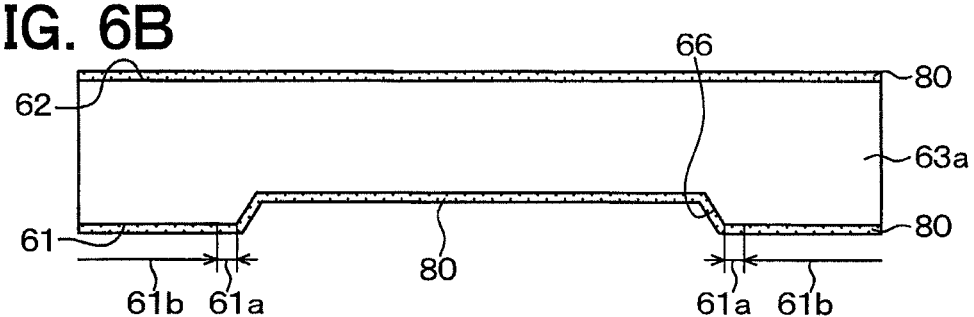

As shown in FIG. 6B, an oxide film 80 is formed on the first surface 61 of the semiconductor wafer 63a. The oxide film 80 is, for example, formed by a thermal oxidation technique or a chemical vapor deposition (CVD) technique. In an example of FIG. 6B, the oxide film 80 is formed on both the first surface 61 and the second surface 62 of the semiconductor wafer 63a. However, it is not always necessary to form the oxide film 80 on the second surface 62. Namely, the oxide film 80 is formed on at least the first surface 61.

The oxide film 80 restricts out-diffusion of an impurity in an annealing step, which will be described later, and restricts channeling. In a case where the oxide film 80 is formed by the thermal oxidization technique, stress is likely to concentrate on the boundary region 61a of the first surface 61 of the semiconductor wafer 63a. Therefore, the thickness of the portion of the oxide film 80 formed on the boundary 61a is greater than the thickness of the portion of the oxide film 80 formed on the bonding region 61b.

Figure 6C:
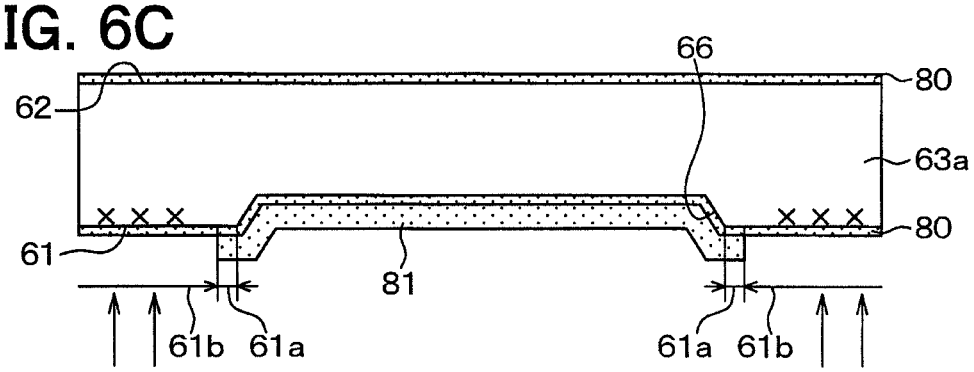

As shown in FIG. 6C, a mask 81, such as a resist, is arranged on the oxide film 80, and is patterned to expose the portion of the oxide film 80 formed on the bonding region 61b.

Then, the impurity, such as boron, arsenic, phosphorous, argon, and xenon, is ion-implanted into the semiconductor wafer 63a from the first surface 61. For example, boron is ion-implanted with a dose amount of $1.0 \times 10^{18}$ cm$^{-2}$ and at an acceleration voltage of 70 keV.

Figure 6D:
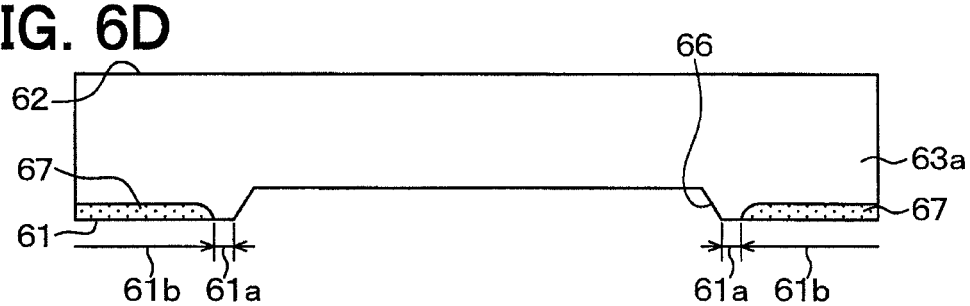

Next, the mask 81 is removed. Further, in a state where the oxide film 80 is maintained for restricting the out-diffusion of the impurity, the annealing is performed for ten minutes at 1000 degrees Celsius (° C.) to activate the impurity. Thus, as shown in FIG. 6D, an impurity layer 67 is formed in a surface layer portion of the semiconductor wafer 63a at a region corresponding to the bonding region 61b. Thereafter, the oxide film 80 is removed.

Figure 6E:
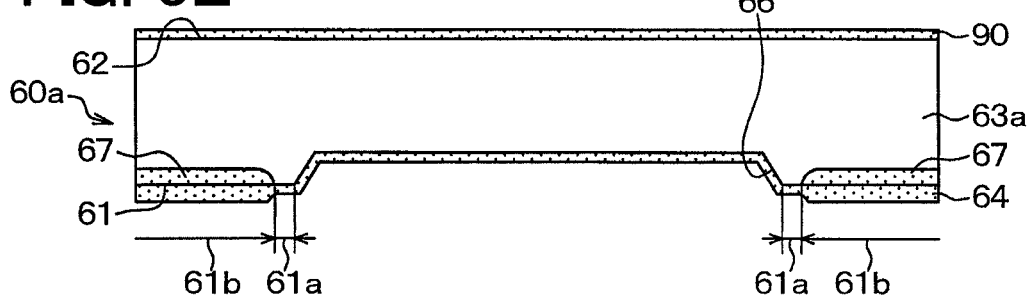

As shown in FIG. 6E, the wet oxidation is performed for the semiconductor wafer 63a such that the thermal oxide film as the insulation film 64 is formed. In this case, an insulation film 90 is formed on the second surface 62 of the semiconductor wafer 63a. For example, the wet oxidation is performed for 11 hours at 950° C.

In a case where the wet oxidation is performed for 11 hours at 950° C. to a semiconductor wafer 63a in which the impurity layer 67 is not formed, an thermal oxide film having a thickness of 1 μm is generally formed. In this case, the thermal oxide film is thickened, that is, raised at the boundary region 61a by 136 nanometers (nm) at most. Namely, the thermal oxide film has a maximum thickness at the boundary region 61a, and the maximum thickness is 1.136 μm, as shown in FIGS. 8A and 8B.

In the present embodiment, on the other hand, the impurity layer 67 is formed by ion-implanting the boron with the dose amount of $1.0 \times 10^{18}$ cm$^{-2}$ and at the acceleration voltage of 70 keV, and by performing the annealing for 10 minutes at 1000° C. In this case, the insulation film 64 is formed such that the portion formed on the bonding region 61b is thickened (risen) by 235 nm, as shown in FIG. 8A. That is, on the bonding region 61b, the insulation film 64 having the film thickness of 1.235 μm is formed.

When the boron is implanted into the semiconductor wafer 63a, the boron is segregated in a thermal oxide film and serves to weaken the bonding structure of the thermal oxide film. The weakened bonding structure accelerates oxidant in the thermal oxide film, resulting in acceleration of the oxidation speed. Therefore, the oxidation speed at the position corresponding to the bonding region 61b is accelerated by the impurity layer 67, as compared to the boundary region 61a. As such, the thickness of the insulation film 64 is greater at the bonding region 61b than that at the boundary region 61a.

Figure 8A:
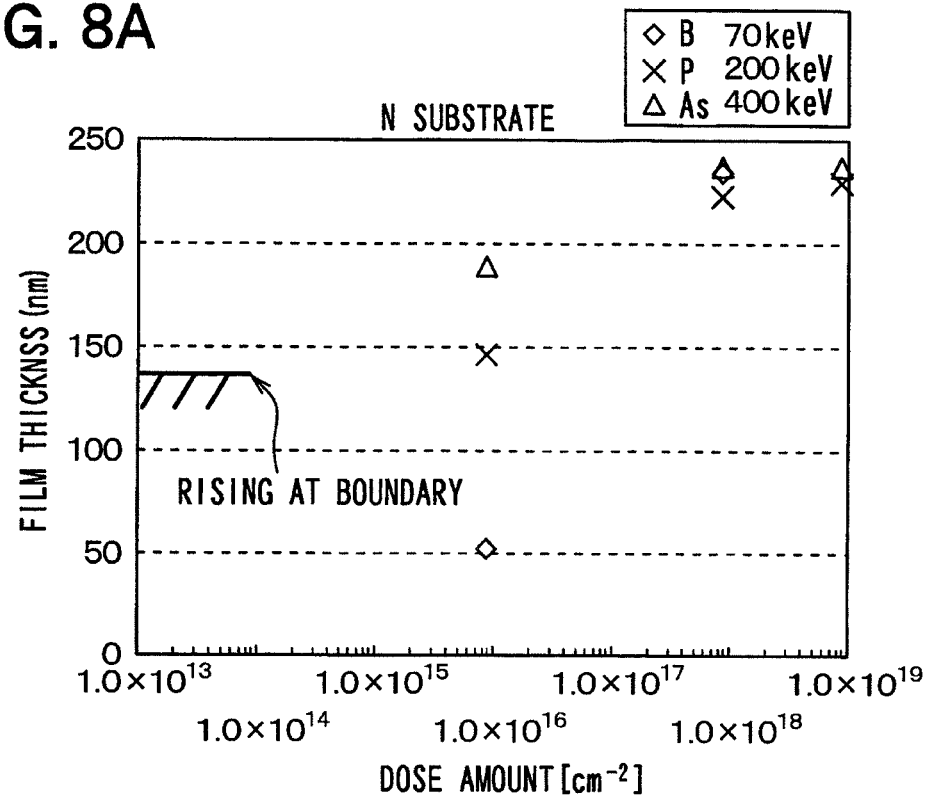
FIG. 8A is a graph illustrating a relationship between a dose amount of an impurity and a thickness of an insulation film, which is provided by a simulation result, when a wet oxidation is performed for an N-type substrate for 11 hours at 950 degrees Celsius according to the first embodiment.
Figure 8B:
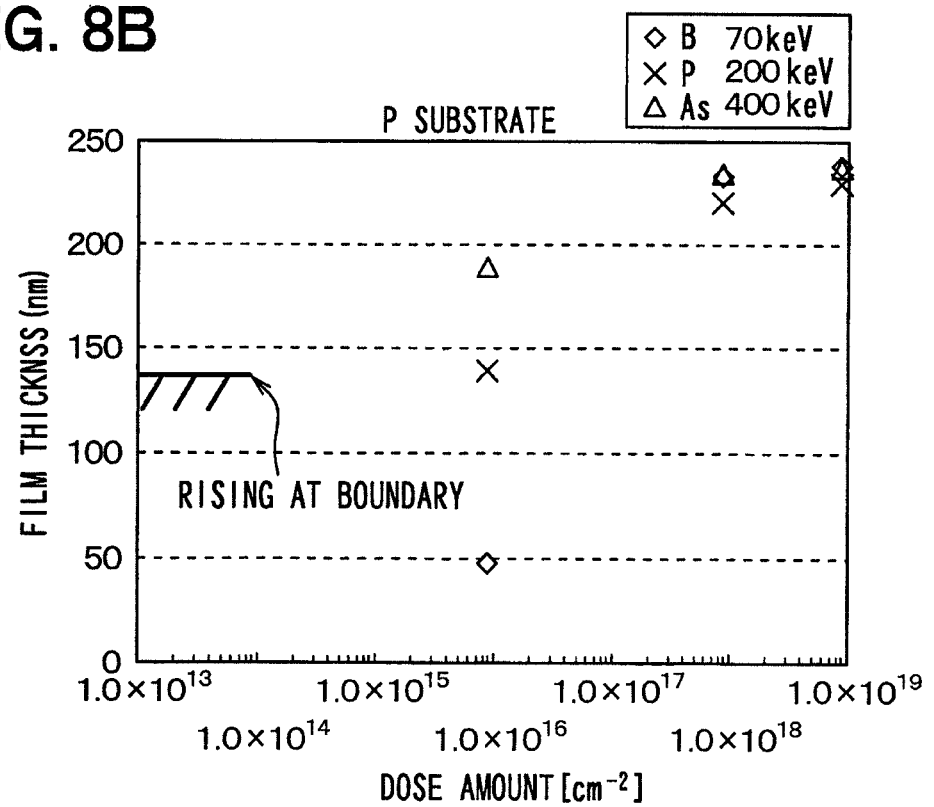
FIG. 8B is a graph illustrating a relationship between a dose amount of an impurity and a thickness of an insulation film, which is provided by a simulation result, when a wet oxidation is performed for a P-type substrate for 11 hours at 950 degrees Celsius according to the first embodiment.

In FIGS. 8A and 8B, the acceleration voltage is suitably adjusted such that a peak depth of the impurity implanted is 0.22 μm. FIG. 8A illustrates a relationship between the dose amount of an impurity and the thickness of the insulation film 64 when an N-type silicon substrate having a (100) surface as the first surface 61 is used. FIG. 8B illustrates a relationship between the dose amount of an impurity and the thickness of the insulation film 64 when a P-type silicon substrate having a (100) surface as the first surface 61 is used. However, the first surface 61 is not limited to the (100) surface. The results similar to FIGS. 8A and 8B are also achieved in substrates having different surface orientations, such as a (111) surface and a (110) surface.

Further, as shown in FIGS. 8A and 8B, the impurity is not limited to the boron. Namely, the thickness of the portion of the insulation film 64 formed on the bonding region 61b can be increased greater than that of the portion of the insulation film 64 formed on the boundary region 61a by forming the impurity layer 67 while suitably adjusting conditions, such as the dose amount and the acceleration voltage.

For example, arsenic may be used as the impurity. In this case, the annealing is performed for 10 minutes at 1000° C., in a similar manner shown in FIG. 6D, and the wet oxidation is performed for 11 hours at 950° C., in a similar manner shown in FIG. 6E. The arsenic is implanted with the dose amount of $1 \times 10^{16}$ cm$^{-2}$ and at the acceleration voltage of 400 keV. Also in this case, the thickness of the portion of the insulation film 64 formed on the bonding region 61b is greater than the thickness of the portion of the insulation film 64 formed on the boundary region 61a.

In this way, a cap wafer 60a in which a part of multiple cap units 60 is formed is produced.

Figure 7A:
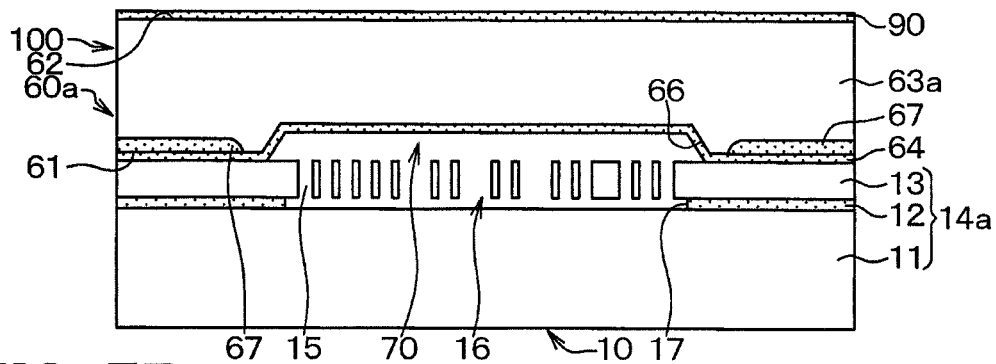
FIGS. 7A to 7D are schematic cross-sectional views for illustrating a bonding process of the sensor unit and the cap unit according to the first embodiment.

Then, as shown in FIG. 7A, the SOI wafer 14a and the cap wafer 60a, which are produced through the above-described processes, are bonded to each other. Namely, the SOI wafer 14a and the semiconductor wafer 63a are bonded to each other through the insulation film 64. For example, the SOI wafer 14a and the cap wafer 60a are placed in a vacuum equipment. Then, an argon (Ar) ion beam is applied to the surface of the semiconductor layer 13 of the SOI wafer 14a and the surface of the insulation film 64 of the cap wafer 60a to activate the surface of the semiconductor layer 13 and the surface of the insulation film 64.

Further, in the vacuum equipment, the SOI wafer 14a and the cap wafer 60a are aligned to each other using alignment marks formed on opposing surfaces of the SOI wafer 14a and the cap wafer 60a through an infrared microscope. The SOI wafer 14a and the cap wafer 60a are bonded to each other by a direct bonding technique at a low temperature that is in a range between the room temperature and 550° C. In particular, the semiconductor layer 13 of the SOI wafer 14a and the portion of the insulation film 64 formed on the bonding region 61b of the cap wafer 60a are bonded to each other.

In this way, the SOI wafer 14a and the cap wafer 60a are bonded to produce a stacked wafer 100. In the stacked wafer 100, the sealed chamber 70 is formed between the SOI wafer 14a and the recessed portion 66. The sealed chamber 70 is formed in each of chip formation regions. In this case, the sealed chamber 70 is vacuum. The SOI wafer 14a and the cap wafer 60a may be bonded by any bonding technique, such as an anode bonding technique and an interlayer bonding.

Figure 7B:
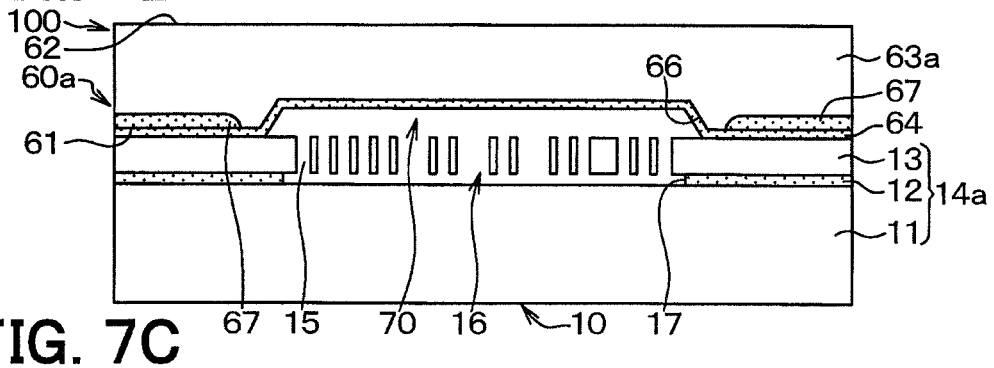

As shown in FIG. 7B, the cap wafer 60a of the stacked wafer 100 is grinded from the surface opposite to the SOI wafer 14a to remove the insulation film 90 and to reduce the thickness of the semiconductor wafer 63a. It is to be noted that this grinding may be performed before the stacked wafer 100 is produced, that is, before the cap wafer 60a and the SOI wafer 14a are bonded to each other.

Figure 7C:
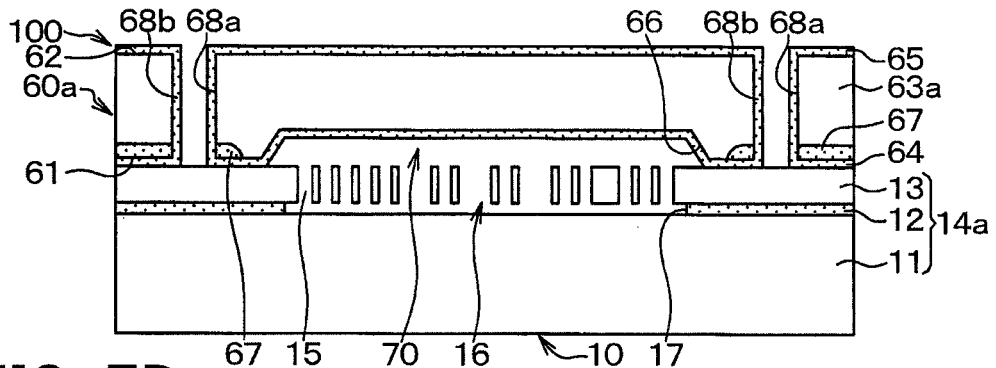

As shown in FIG. 7C, four through holes 68a are formed in the cap wafer 60a by etching portions of the semiconductor wafer 63a and the insulation film 64, the portions corresponding to the anchor portion 23b, the wiring portions 32, 42 and the peripheral portion 50. Then, the insulation film 68b, which is for example made of the TEOS, is formed on the wall surfaces defining the through holes 68a. In this case, the insulation film 65 is provided by the insulation film formed on the second surface 62 of the semiconductor wafer 63a. Next, the insulation film 68b formed at the bottom of each of the through holes 68a is removed to expose the semiconductor layer 13.

Figure 7D:
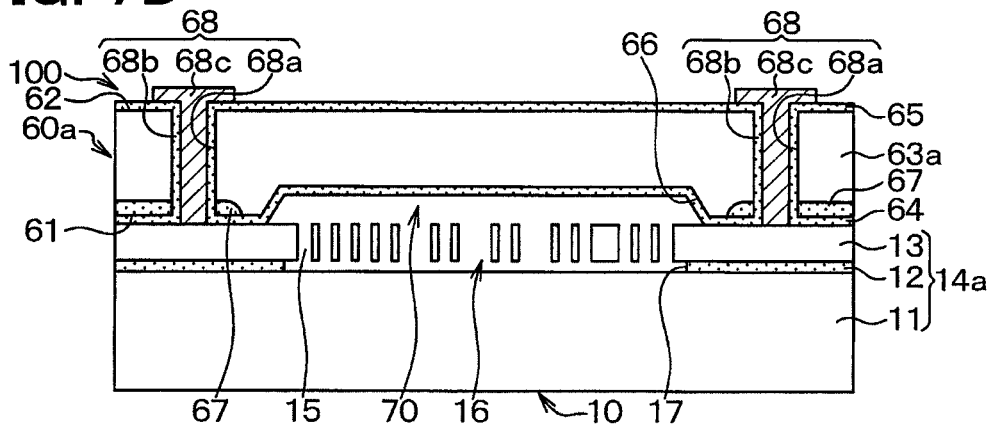

Then, as shown in FIG. 7D, a metal, such as aluminum (Al) or aluminum and silicon alloy (Al—Si), is embedded in each through hole 68a such as by a spattering technique or a vapor deposition technique to form the penetrating electrode portions 68c. The penetrating electrode portions 68c are electrically coupled to the anchor portion 23b, the wiring portions 32, 42 and the peripheral portion 50. Further, the metal disposed on the insulation film 65 is patterned into the pad shape.

Thereafter, although not illustrated, the stacked wafer 100 is divided into chips. Accordingly, the semiconductor device shown in FIG. 1 is produced.

In the present embodiment described above, the sensor unit 10 and the semiconductor substrate 63 are bonded through the insulation film 64 that is formed on the bonding region 61b of the first surface 61 of the semiconductor substrate 63. The bonding region 61b has the area greater than the area of the boundary region 61a. As such, a bonding area between the sensor unit 10 and the semiconductor substrate 63 is increased, and a bonding property improves.

When the insulation film 64 is formed on the semiconductor wafer 63a, the impurity layer 67 is formed in the semiconductor wafer 63a such that the oxidation is partly accelerated. Therefore, the thickness of the portion of the insulation film 64 formed on the bonding region 61*b* is greater than the thickness of the portion of the insulation film 64 formed on the boundary region 61*a*. As such, when the SOI wafer 14*a* and the cap wafer 60*a* are bonded to each other, the semiconductor layer 13 and the portion of the insulation film 64 formed on the bonding region 61*b* are bonded to each other. Accordingly, the bonding area between the SOI wafer 14*a* and the cap wafer 60*a* is increased, and hence the bonding property improves.

In the manufacturing method described above, it is not necessary to flatten the surface of the cap wafer 60*a* after the insulation film 64 is formed. Therefore, drawbacks, such as poor bonding or an abnormality in sensor characteristics, are reduced. The semiconductor substrate 63 has the recessed portion 66. Therefore, the sensing part 60 having a structure similar to a conventional structure may be used. Accordingly, a drawback, such as an abnormality in sensor characteristics, is reduced.

(Second Embodiment)

A second embodiment of the present disclosure will be described with reference to FIGS. 9A to 9D.

In the second embodiment, a manufacturing process of the cap unit 60 is modified from that of the first embodiment. Other features are similar to those of the first embodiment, and thus descriptions thereof will not be repeated.

Figure 9A:
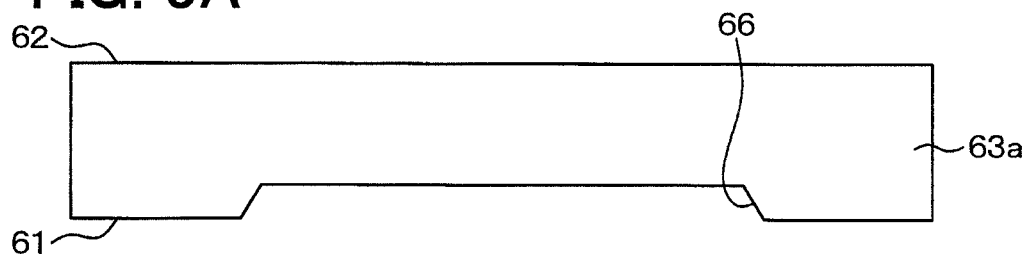
FIGS. 9A to 9D are schematic cross-sectional views for illustrating a manufacturing process of a cap unit of a semiconductor device according to a second embodiment of the present disclosure.

In the present embodiment, as shown in FIG. 9A, the recessed portion 66 is formed in the semiconductor wafer 63*a*, in a similar manner shown in FIG. 6A.

Figure 9B:
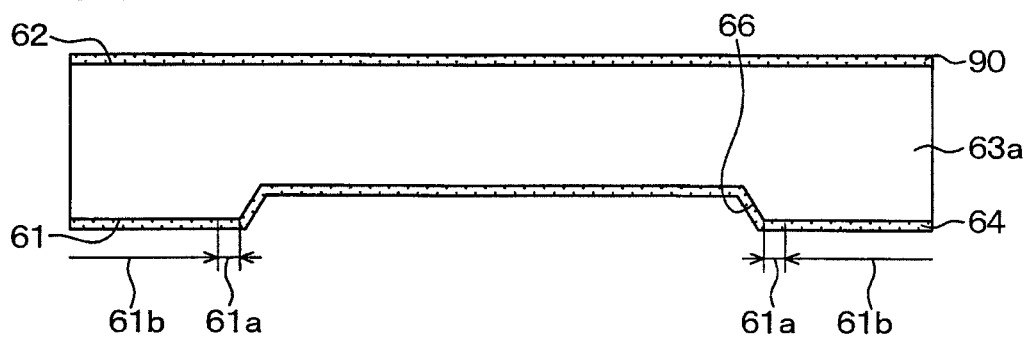

Then, as shown in FIG. 9B, the wet oxidation is performed for 11 hours at 950° C. to form the insulation film 64 on the first surface 61 and the insulation film 90 on the second surface 62. Although not illustrated in detail in FIG. 9B, the thickness of the portion of the insulation film 64 formed on the boundary region 61*a* is greater than the thickness of the portion of the insulation film 64 formed on the bonding region 61*b*.

Figure 9C:
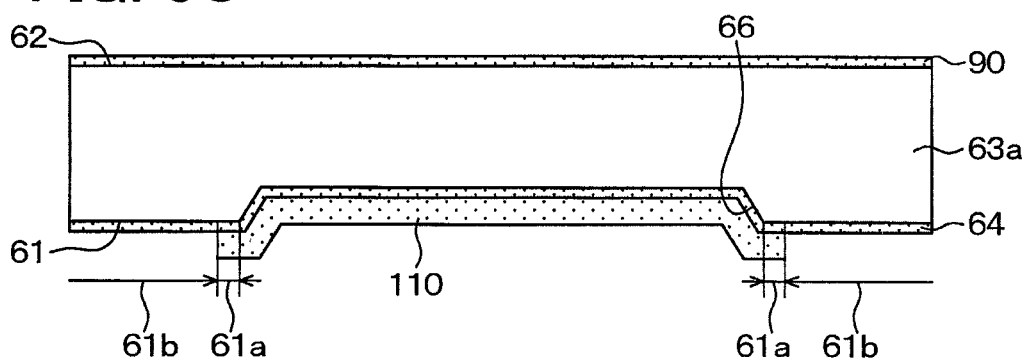

As shown in FIG. 9C, a nitride film 110 as an oxygen non-transmission film is formed on the insulation film 64. Further, the nitride film 110 is patterned such that the portion of the insulation film 64 formed on the boundary region 61*b* is exposed.

Figure 9D:
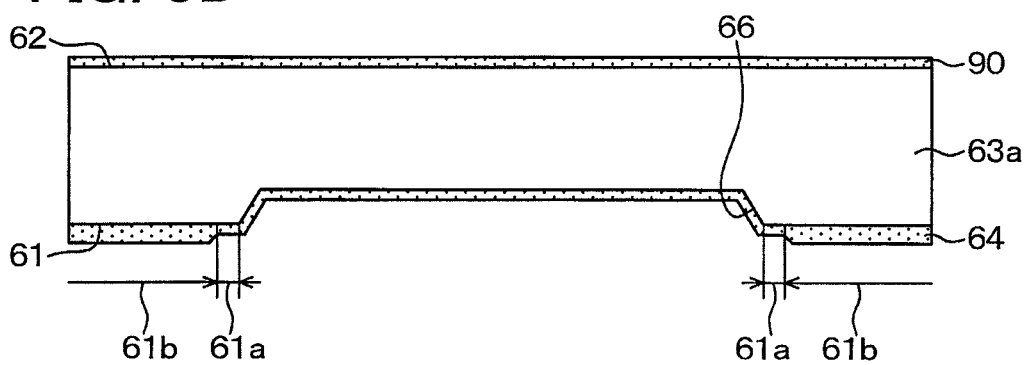

As shown in FIG. 9D, the wet oxidation is performed again for the semiconductor wafer 63*a* for 11 hours and 950° C. Namely, a region that is not covered with the nitride film 110 is oxidized again, and hence an oxide film, which is called as a LOCOS (local oxidation on silicon) oxide film, is formed. As such, the insulation film 64 having the greater thickness on the bonding region 61*b* than that on the boundary region 61*a* can be formed. Namely, the thickness of the portion of the insulation film 64 formed on the bonding region 61*b* can be increased greater than the thickness of the portion of the insulation film 64 formed on the boundary region 61*a*.

Thereafter, the nitride film 110 is removed. Then, the SOI wafer 14*a* and the cap wafer 60*a* are bonded to each other, in a similar manner to the first embodiment. Further, the penetrating electrodes 68 are formed in the stacked wafer 100, and the stacked wafer 100 is divided into chips. Accordingly, the semiconductor device shown in FIG. 1 is produced.

Also in the manufacturing method described above, the SOI wafer 14*a* and the cap wafer 60*a* are bonded to each other such that the semiconductor layer 13 and the portion of the insulation film 64 formed on the bonding region 61*b* are bonded to each other. Accordingly, the advantageous effects similar to the first embodiment will be achieved.

(Third Embodiment)

A third embodiment will be described with reference to FIG. 10, 11, 12A to 12D.

In the third embodiment, the boundary region 61*a* of the first surface 61 of the semiconductor substrate 63 is not covered with the insulation film 64. Other structures of the third embodiment are similar to those of the first embodiment, and thus descriptions thereof will not be repeated.

Figure 10:
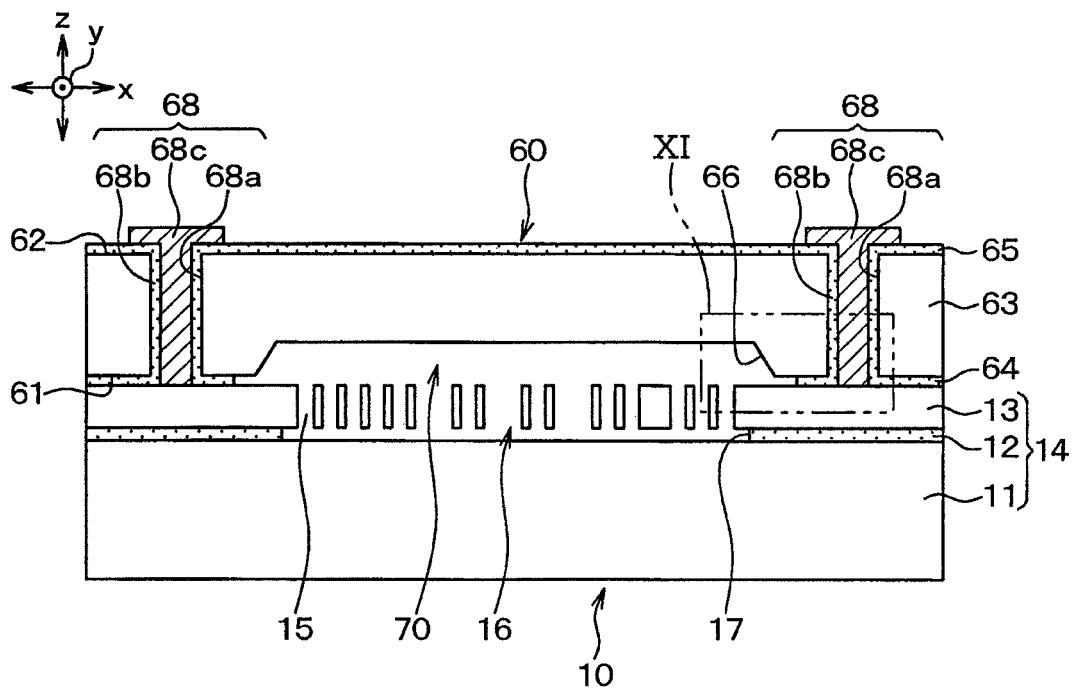
FIG. 10 is a schematic cross-sectional view of a semiconductor device according to a third embodiment of the present disclosure.
Figure 11:
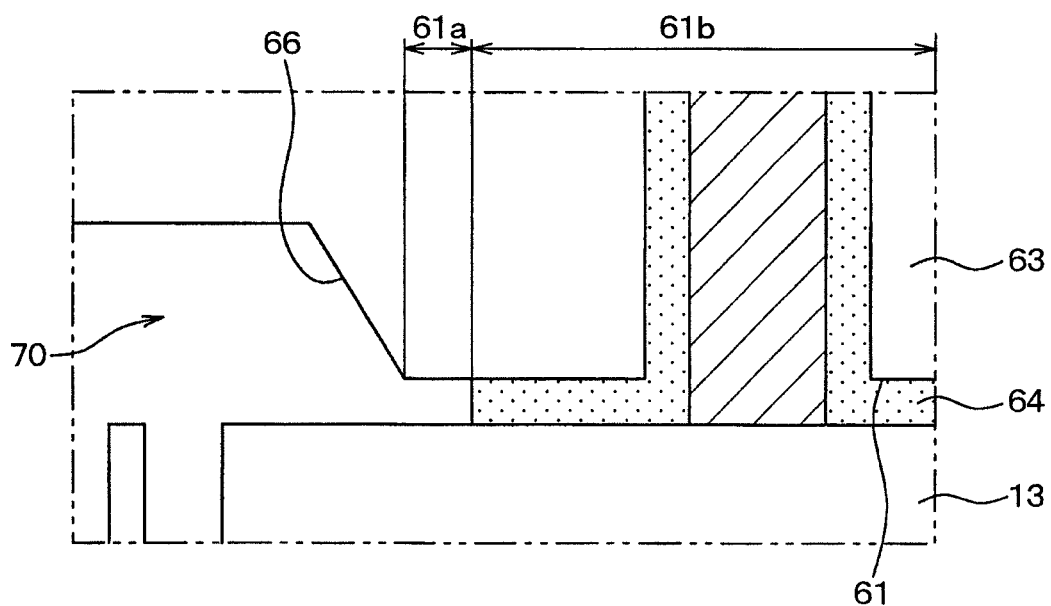
FIG. 11 is an enlarged schematic cross-sectional view of a part XI of the semiconductor device shown in FIG. 11.

As shown in FIGS. 10 and 11, the cap unit 60 has the insulation film 64 only on the bonding region 61*b* of the first surface 61 of the semiconductor substrate 63. That is, the recessed portion 66 and the boundary region 61*a* are not covered with the insulation film 64, and are exposed from the insulation film 64.

Further, the semiconductor layer 13 of the sensor unit 10 and the insulation film 64 formed on the bonding region 61*b* of the semiconductor substrate 63 are bonded to each other.

The cap unit 60 of the present embodiment is produced in a following manner.

Figure 12A:
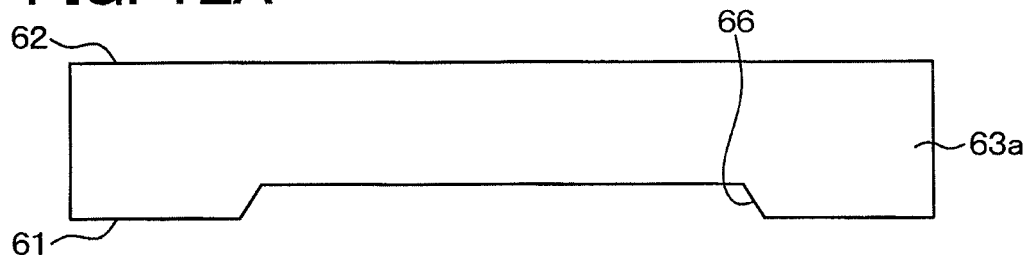
FIGS. 12A to 12D are schematic cross-sectional views for illustrating a manufacturing process of a cap unit of the semiconductor device shown in FIG. 10.

As shown in FIG. 12A, the recessed portion 66 is formed in the semiconductor wafer 63*a*, in a similar manner shown in FIG. 6A.

Figure 12B:
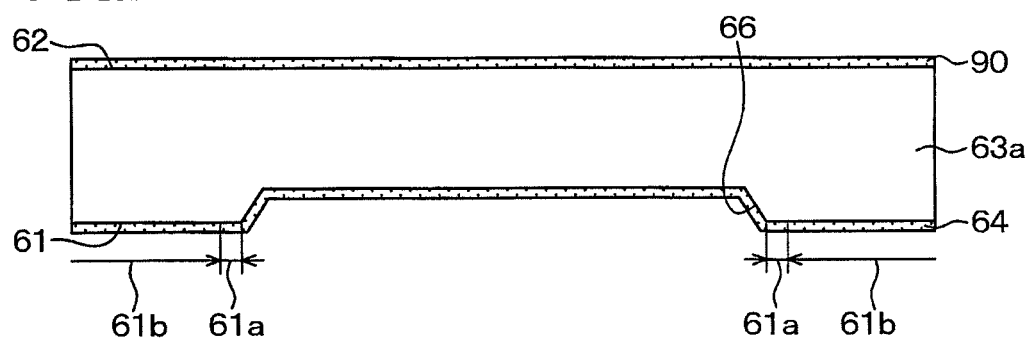

Next, as shown in FIG. 12B, the wet oxidation is performed for 11 hours at 950° C. Thus, the insulation film 64 is formed on the first surface 61, and the insulation film 90 is formed on the second surface 62. Although not illustrated in detail in FIG. 12B, the thickness of the portion of the insulation film 64 formed on the boundary region 61*a* is greater than the thickness of the portion of the insulation film 64 formed on the bonding region 61*b*.

Figure 12C:
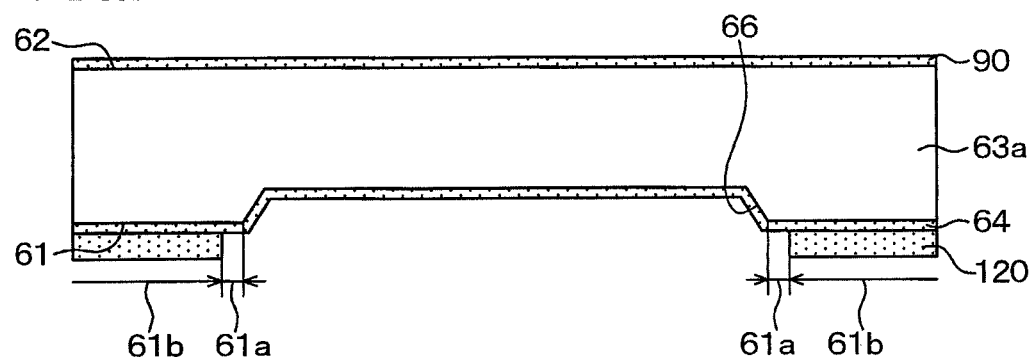

As shown in FIG. 12C, a mask 120 is formed on the insulation film 64, and is patterned such that the portions of the insulation film 64 formed on the boundary region 61*a* and the recessed portion 66 are exposed.

Figure 12D:
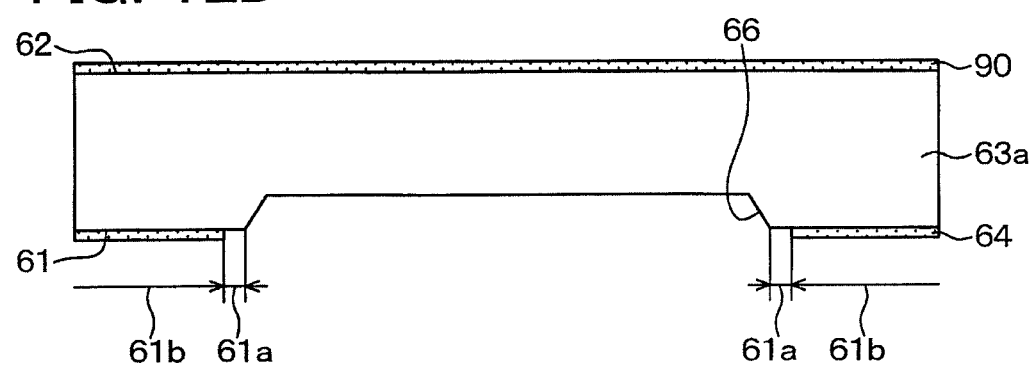

Then, as shown in FIG. 12D, the portions of the insulation film 64 formed on the boundary region 61*a* and the recessed portion 66 are removed by an etching technique. Therefore, the insulation film 64 remains only on the bonding region 61*b* of the first surface 61.

Thereafter, the SOI wafer 14*a* and the cap wafer 60*a* are bonded to each other, in a similar manner to the first embodiment. Further, the penetrating electrodes 68 and the like are formed and the stacked wafer 100 is divided into chips. As such, the semiconductor device shown in FIG. 10 is produced.

Also in the semiconductor device described above, the semiconductor substrate 63 is bonded to the sensor unit 10 through the insulation film 64 formed on the bonding region 61*b*. Therefore, the advantageous effects similar to the first embodiment will be achieved.

In the present embodiment, the insulation film 64 is exemplarily formed on the first surface 61 of the semiconductor substrate 63 by the wet oxidation. However, the insulation film 64 may be formed by any other technique, such as a CVD technique.

(Fourth Embodiment)

A fourth embodiment will be described with reference to FIGS. 13A to 13E.

In the fourth embodiment, a manufacturing process of the cap unit 60 is modified from that of the third embodiment. Other features are similar to the third embodiment, and thus descriptions thereof will not be repeated.

Figure 13A:
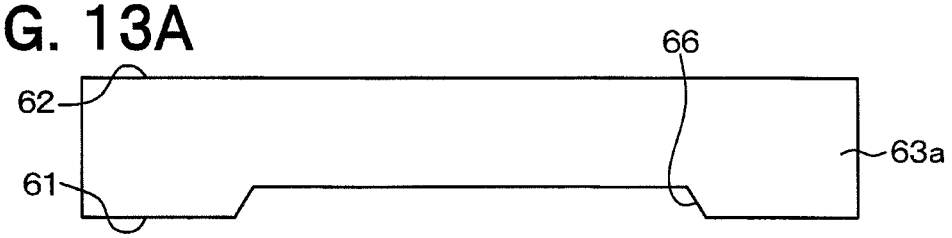
FIGS. 13A to 13E are schematic cross-sectional views for illustrating a manufacturing process of a cap unit of a semiconductor device according to a fourth embodiment of the present disclosure.

As shown in FIG. 13A, the recessed portion 66 is formed in the semiconductor wafer 63*a*, in a similar manner shown in FIG. 12A.

Figure 13B:
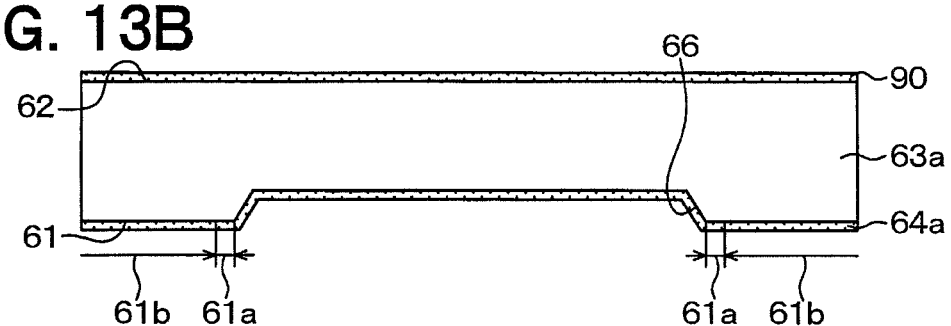

Next, as shown in FIG. 13B, the wet oxidation is performed for the semiconductor wafer 63*a*, in a similar manner to the wet oxidation shown in FIG. 12B. Thus, a first insulation film 64*a* is formed on the first surface 61 of the semiconductor wafer 63*a*, and the insulation film 90 is formed on the second surface 62 of the semiconductor wafer 63*a*.

Figure 13C:
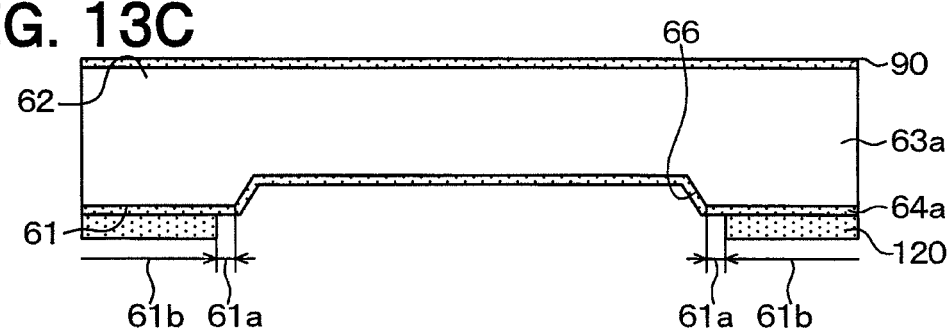

Then, as shown in FIG. 13C, the mask 120 is formed on the first insulation film 64a and is patterned such that the portions of the first insulation film 64a formed on the boundary region 61a and the recessed portion 66 are exposed, by performing a similar process to FIG. 12C.

Figure 13D:
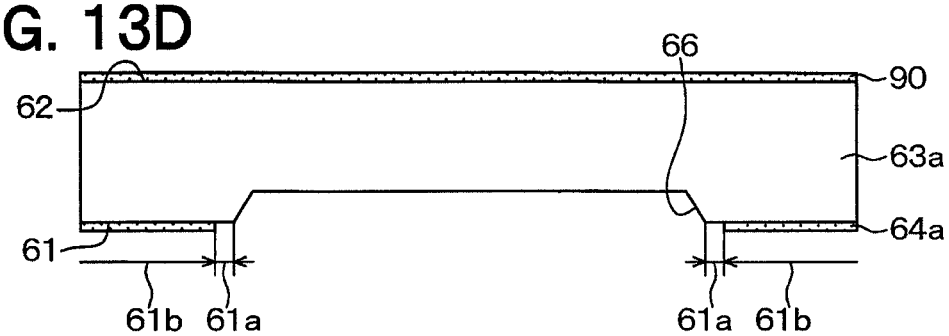

Further, as shown in FIG. 13D, the portions of the first insulation film 64a formed on the boundary region 61a and the recessed portion 66 are removed, by performing a similar process to FIG. 12D. Thus, the first insulation film 64a remains only on the bonding region 61b of the first surface 61.

Figure 13E:
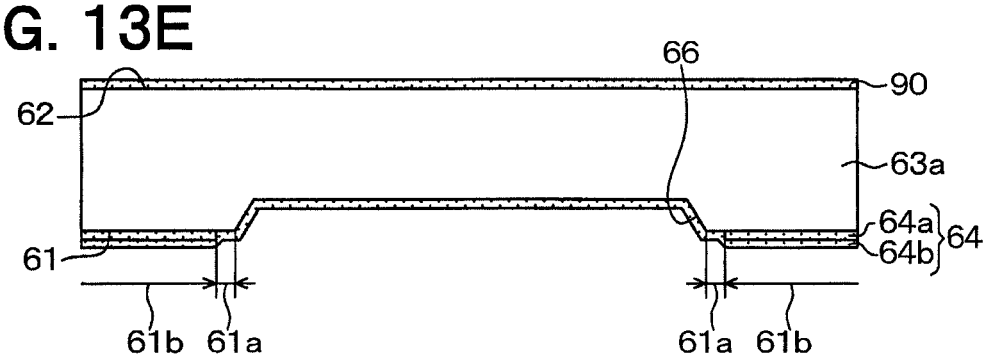

Next, as shown in FIG. 13E, the wet oxidation is performed again. Thus, on the recessed portion 66 and the boundary region 61a, the insulation film 64 only composed of a second insulation film 64b is formed. On the bonding region 61b, the insulation film 64 composed of the first insulation film 64a and the second insulation film 64b is formed. As such, the thickness of the portion of the insulation film 64 formed on the bonding region 61b is greater than the thickness of the portion of the insulation film 64 formed on the boundary region 61a.

Thereafter, similar to the first embodiment, the SOI wafer 14a and the cap wafer 60a are bonded to each other to produce the stacked wafer 100. Further, the penetrating electrodes 68 and the like are formed, and the stacked wafer 100 is divided into chips. Thus, the semiconductor device shown in FIG. 1 is produced.

Also in the manufacturing method described above, the semiconductor substrate 63 is bonded to the sensor unit 10 through the portion of the insulation film 64 formed on the bonding region 61b. Therefore, the advantageous effects similar to the first embodiment will be achieved.

In the present embodiment, the second insulation film 64b is formed on the surface of the recessed portion 66. Therefore, current leakage is reduced.

In the present embodiment, the first insulation film 64a and the second insulation film 64b are exemplarily formed on the first surface 61 of the semiconductor substrate 63 by the wet oxidation. However, the first insulation film 64a and the second insulation film 64b may be formed by any other technique, such as by a CVD technique. As another example, one of the first insulation film 64a and the second insulation film 64b may be formed by the wet oxidation, and the other of the first insulation film 64a and the second insulation film 64b may be formed by the CVD technique.

(Fifth Embodiment)

A fifth embodiment of the present disclosure will be described with reference to FIGS. 14A to 14D, 15A and 15B.

In the fifth embodiment, a manufacturing process of the cap unit 60 is modified from that of the first embodiment. Other features are similar to the first embodiment, and thus descriptions thereof will not be repeated.

Figure 14A:
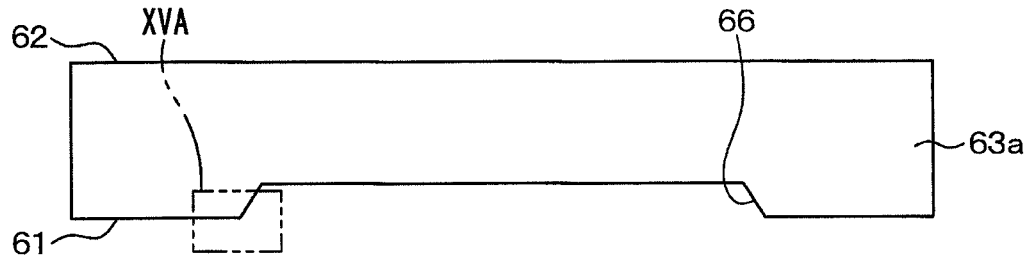
FIGS. 14A to 14D are schematic cross-sectional views for illustrating a manufacturing process of a cap unit of a semiconductor device according to a fifth embodiment of the present disclosure.
Figure 15A:
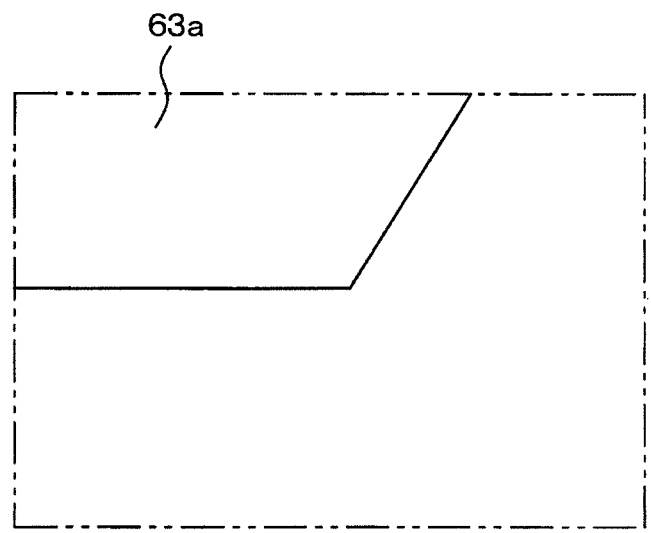
FIG. 15A is an enlarged schematic cross-sectional view of a part XVA of the cap unit shown in FIG. 14A.
Figure 15B:
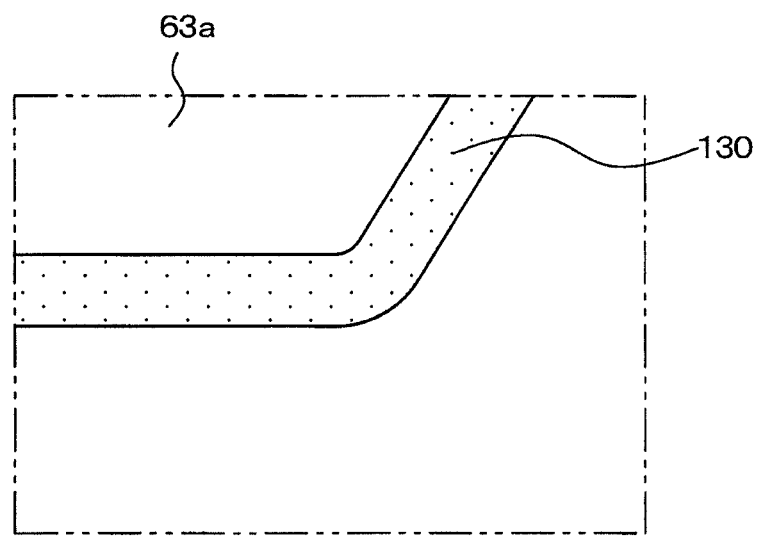
FIG. 15B is an enlarged schematic cross-sectional view of a part XVB of the cap unit shown in FIG. 14B.

As shown in FIG. 14A, the recessed portion 66 is formed in the semiconductor wafer 63a, in a similar manner shown FIG. 6A. In this case, the opening edge of the recessed portion 66 has an angulated shape, as shown in FIG. 15A.

Figure 14B:
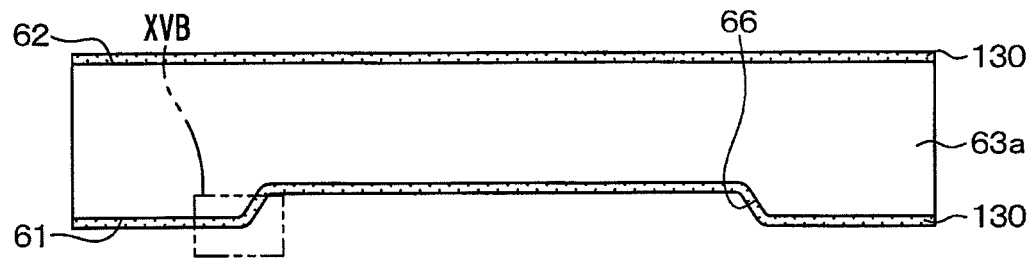

Next, as shown in FIG. 14B, a wet oxidation is performed for 2 hours at a high temperature, such as at 1170° C., to round the opening edge of the recessed portion 66. In this case, thermal oxide films 130 are formed on the first surface 61 and the second surface 62.

Figure 14C:
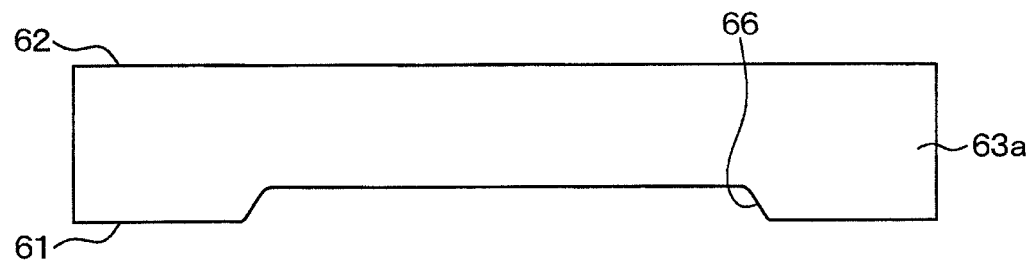

Next, as shown in FIG. 14C, the thermal oxide films 130 formed on the first surface 61 and the second surface 62 are removed.

Figure 14D:
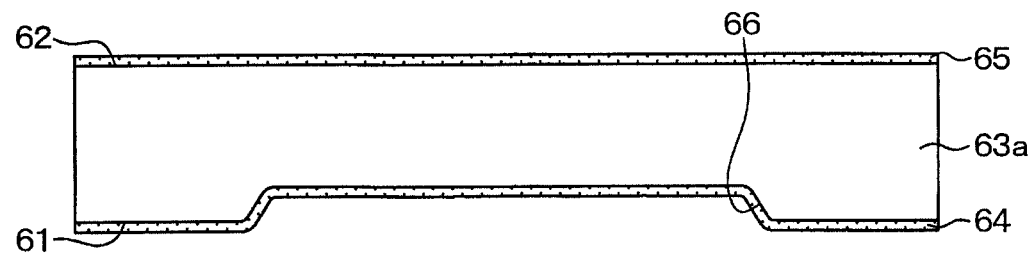

Then, as shown in FIG. 14D, a wet oxidation is performed for 11 hours at 950° C. Thus, the insulation film 64 is formed on the first surface 61, and the insulation film 90 is formed on the second surface 62. Since the opening edge of the recessed portion 66 has been rounded, it is less likely that the stress will concentrate on the boundary region 61a. Therefore, in the wet oxidation of FIG. 14D, the insulation film 64 having a uniform thickness is formed on the first surface 61 (on the boundary region 61a and the bonding region 61b).

Thereafter, similar to the first embodiment, the SOI wafer 14a and the cap wafer 60a are bonded to each other to produce the stacked wafer 100. The penetrating electrodes 68 and the like are formed, and the stacked wafer 100 is divided into chips. Thus, the semiconductor device shown in FIG. 1 is produced.

In the manufacturing method described above, the insulation film 64 having the uniform thickness is formed on the boundary region 61a and the bonding region 61b. Therefore, when the SOI wafer 14a and the cap wafer 60a are bonded to each other, the semiconductor layer 13 and the insulation film 64 that is formed on the boundary region 61a and the bonding region 61b can be bonded to each other. Namely, the bonding area between the sensor unit 10 and the cap unit 60 further increases. Accordingly, the bonding property between the sensor unit 10 and the cap unit 60 further improves.

(Sixth Embodiment)

A sixth embodiment will be described with reference to FIGS. 16 and 17.

In the sixth embodiment, a structure of the cap unit 60 is modified from that of the first embodiment. Other features are similar to the first embodiment, and thus descriptions thereof will not be repeated.

Figure 16:
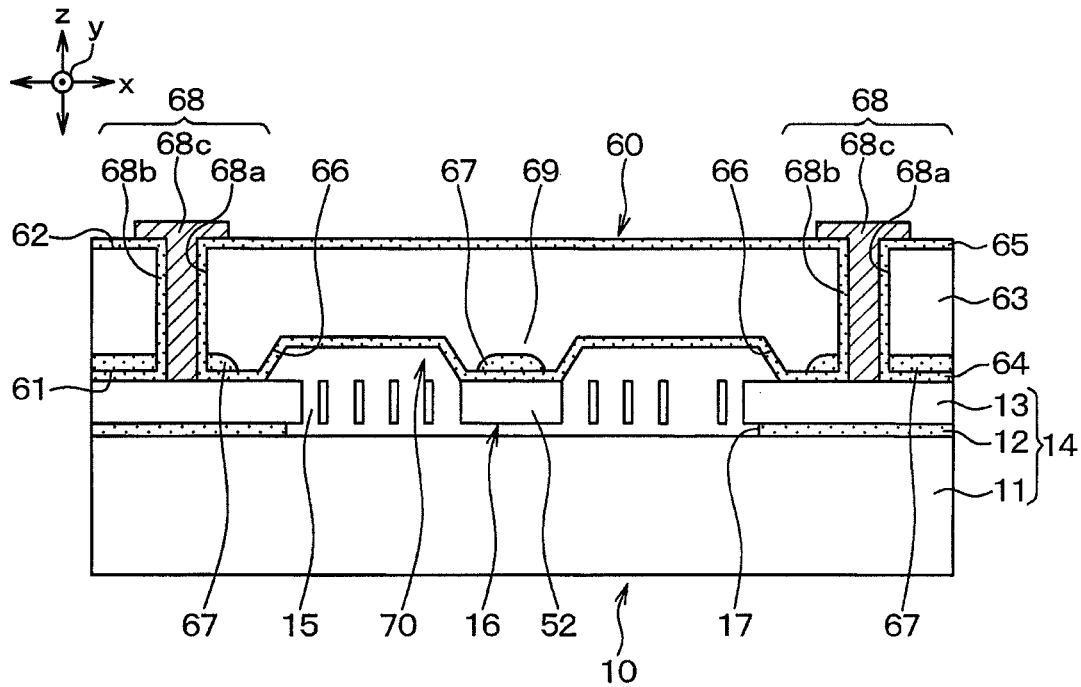
FIG. 16 is a schematic cross-sectional view of a semiconductor device according to a sixth embodiment of the present disclosure.
Figure 17:
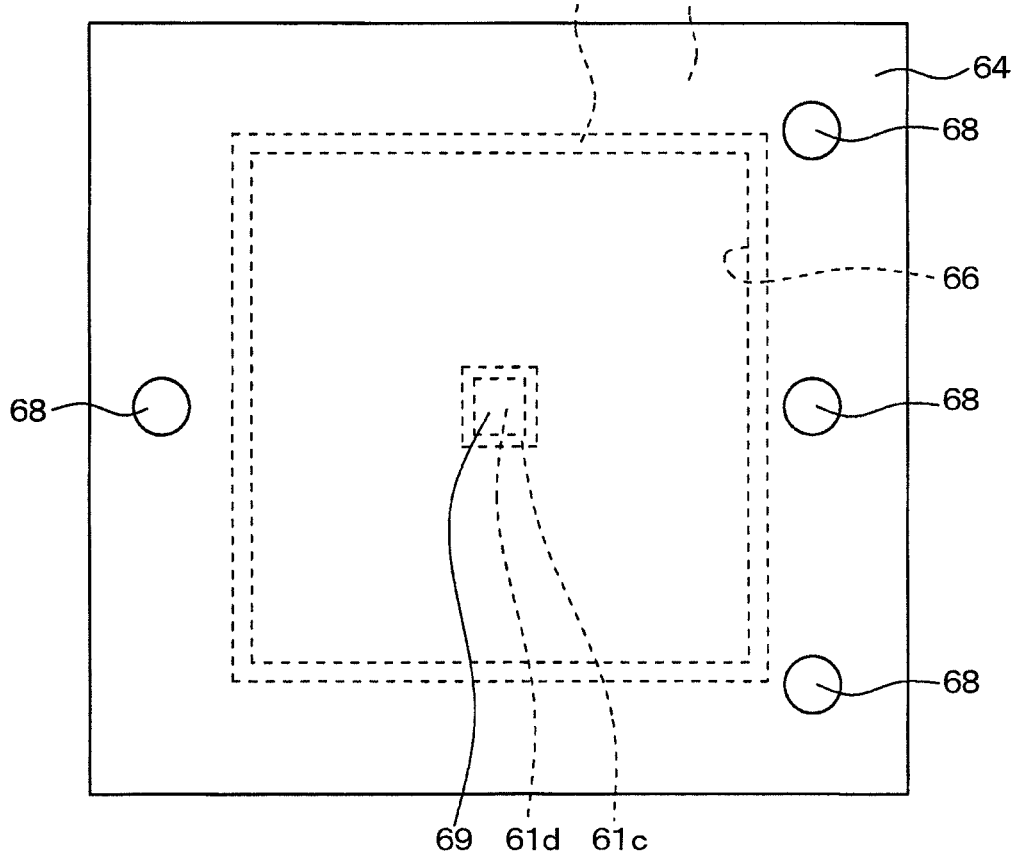
FIG. 17 is a plan view of a cap unit of the semiconductor device shown in FIG. 16.

In the present embodiment, as shown in FIGS. 16 and 17, the recessed portion 66 formed in the semiconductor substrate 63 has a rectangular frame shape such that a pillar portion 69 is formed inside of the recessed portion 66. The pillar portion 69 is provided by the semiconductor substrate 63. The insulation film 64 is formed on the first surface 61 of the semiconductor substrate 63, the first surface 61 including an end surface of the pillar portion 69. The end surface of the pillar portion 69 corresponds to a part of the first surface 61 of the semiconductor substrate 63.

In this case, the thickness of the portion of the insulation film 64 formed on an inner bonding region 61d of the end surface of the pillar portion 69 is greater than the thickness of the portion of the insulation film 64 formed on an inner boundary region 61c of the end surface of the pillar portion 69. As shown in FIG. 17, the inner boundary region 61c corresponds to a region defining the boundary between an inner perimeter of the frame shaped recessed portion 66 and the end surface of the pillar portion 69. The inner bonding region 61d corresponds to a region surrounded by the inner boundary region 61c on the end surface of the pillar portion 69. In this case, the boundary region 61a is also referred to an outer boundary region 61a, and the bonding region 61b is also referred to as an outer bonding region 61b. Further, the thickness of the portion of the insulation film 64 formed on the inner bonding region 61d is equal to the thickness of the portion of the insulation film 64 formed on the outer bonding region 61b.

In this case, the inner bonding region 61d is a region surrounded by the inner boundary region 61c on the end surface of the pillar portion 69. The area of the inner bonding region 61d is greater than the area of the inner boundary region 61c.

As shown in FIG. 16, an impurity layer 67 is formed in a surface layer portion of the pillar portion 69 in a region corresponding to the inner bonding region 61d. The impurity layer 67 of the pillar portion 69 is formed so as to increase the thickness of the insulation film 64 on the inner bonding region 61d than that on the inner boundary region 61c when the insulation film 64 is formed on the first surface 61 of the semiconductor substrate 63, similar to the impurity layer 67 of the outer bonding region 61b.

The sensor unit 10 includes the sensing part 16 having a shape different from the sensing part 16 shown in FIG. 2. The sensing part 16 of the present embodiment has a bonding portion 52 to be bonded to the cap unit 60.

The cap unit 60 having the pillar portion 69 is bonded to the sensor unit 10. In particular, the portion of the insulation film 64 formed on the outer bonding region 61b and the portion of the insulation film 64 formed on the inner bonding region 61d are bonded to the semiconductor layer 13 of the sensor unit 10.

As described above, the present disclosure is employed to the semiconductor device in which the bonding portion 52 disposed in the sensing part 16 is bonded to the pillar portion 69 of the cap unit 60.

The semiconductor device described above is produced by forming the recessed portion 66 into the frame shape and by ion-implanting the impurity to the inner bonding region 61d in addition to the outer bonding region 61b, in the manufacturing method of the first embodiment.

(Seventh Embodiment)

A seventh embodiment of the present disclosure will be described with reference to FIG. 18.

In the present embodiment, the cap unit 60 has a structure different from that of the sixth embodiment. Other features are similar to the sixth embodiment, and thus descriptions thereof will not be repeated.

Figure 18:
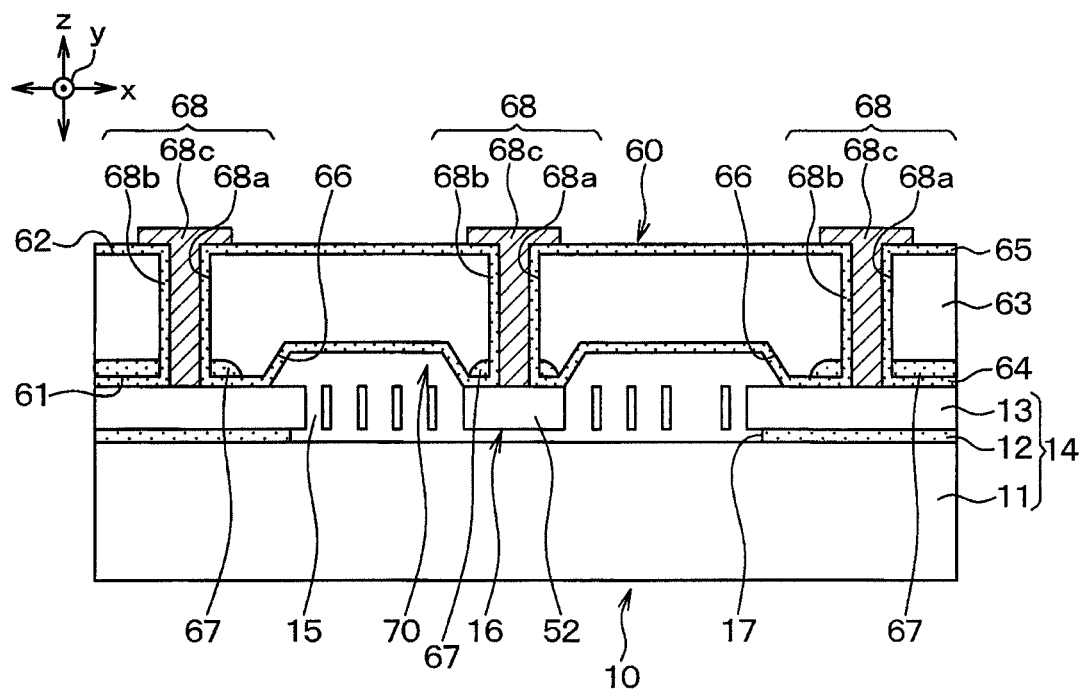
FIG. 18 is a schematic cross-sectional view of a semiconductor device according to a seventh embodiment of the present disclosure.

In the present embodiment, as shown in FIG. 18, the penetrating electrode 68 is formed also in the pillar portion 69. The sensor unit 10 is electrically coupled to an external device also through the penetrating electrode 68 formed in the pillar portion 69. Namely, the present disclosure can be employed to the semiconductor device that needs the electric coupling between the inside of the sensing part 16 and an external device.

(Eighth Embodiment)

An eighth embodiment will be described with reference to FIGS. 19A to 19D.

A semiconductor device of the eighth embodiment has a similar structure to the semiconductor of the first embodiment, except that the SOI wafer 14a and the semiconductor wafer 63a are bonded to each other after the insulation film 64 is formed on the SOI wafer 14a. Other features of the eighth embodiment are similar to those of the first embodiment, and thus descriptions thereof will not be repeated.

Figure 19A:
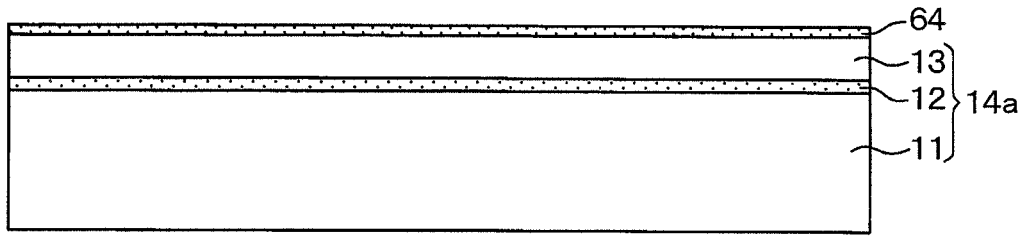
FIGS. 19A to 19D are schematic cross-sectional views for illustrating a manufacturing process of a sensor unit of a semiconductor device according to an eighth embodiment of the present disclosure.

In the present embodiment, as shown in FIG. 19A, the SOI wafer 14a is prepared. Then, the insulation film 64 is formed on the semiconductor layer 13 of the SOI wafer 14a. The insulation film 64 may be made by any technique, such as a wet oxidation technique and a CVD technique.

Figure 19B:
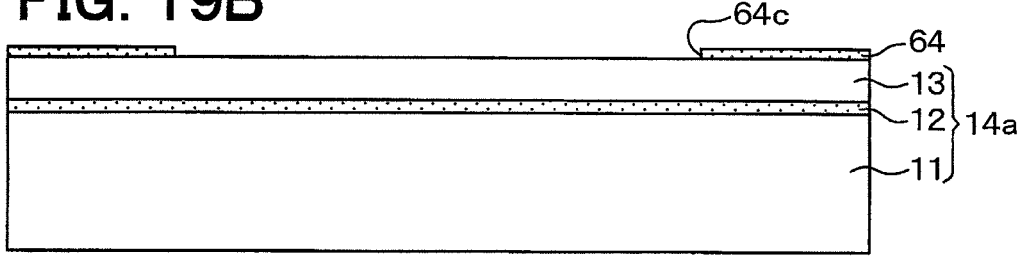

As shown in FIG. 19B, the insulation film 64 is patterned to form an opening 64c such that a sensing part formation region of the semiconductor layer 13 where the sensing part 16 is to be formed is exposed.

Figure 19C:
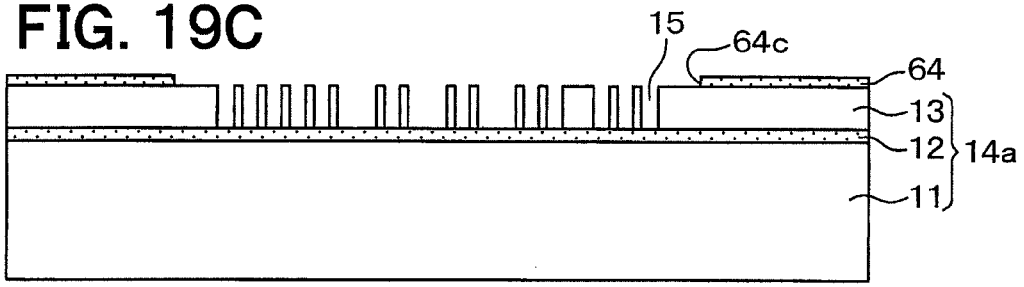
Figure 19D:
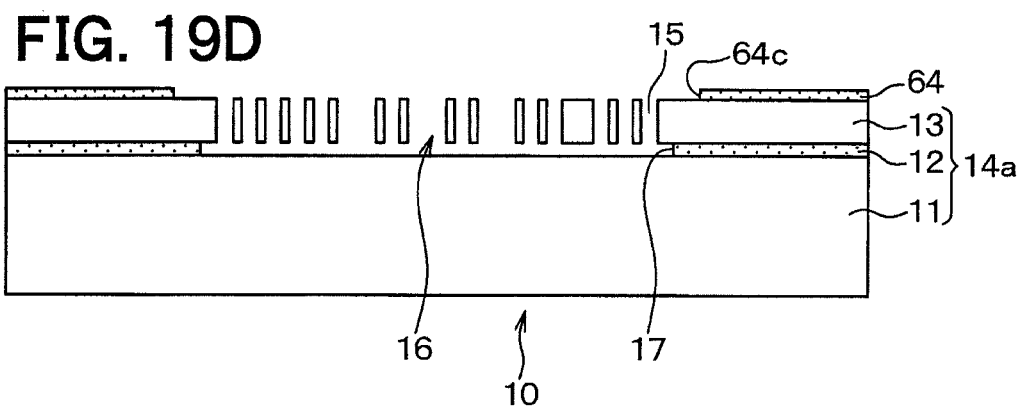

Next, as shown in FIGS. 19C and 19D, the sensing part 16 is formed in the SOI wafer 14a by performing the similar process to FIGS. 5B and 5C.

Thereafter, the SOI wafer 14a and the cap wafer 60a are bonded to each other to produce the stacked wafer 100, in a similar manner to the first embodiment. The penetrating electrodes 68 are formed, and the stacked wafer 100 is divided into chips. Accordingly, the semiconductor device shown in FIG. 1 is produced.

Also in the semiconductor device produced by the above-described method, the SOI wafer 14a and the semiconductor wafer 63a are bonded to each other through the insulation film 64. Because the insulation film 64 is formed on a flat surface of the semiconductor layer 13, even if the insulation film 64 is made by the wet oxidation, it is less likely that the insulation film 64 will be partly thickened. Accordingly, the bonding area between the SOI wafer 14a and the semiconductor wafer 63a is increased.

(Other Embodiments)

In the semiconductor devices of the embodiments described above, the sensing part 16 for detecting an acceleration is exemplarily formed in the sensor unit 10. However, the sensing part 16 is not limited to the sensor detecting the acceleration. For example, the sensing part 16 formed in the sensor unit 10 may be a sensor for detecting an angular velocity. Also, the structure of the sensing part 16 is not limited to the embodiments described above. Namely, it is not always necessary that the sensing part 16 has the movable part 20. The sensing part 16 may not have the movable part 20. The sensing part 16 may be configured such that a resistance value changes in accordance with the temperature.

Figure 20:
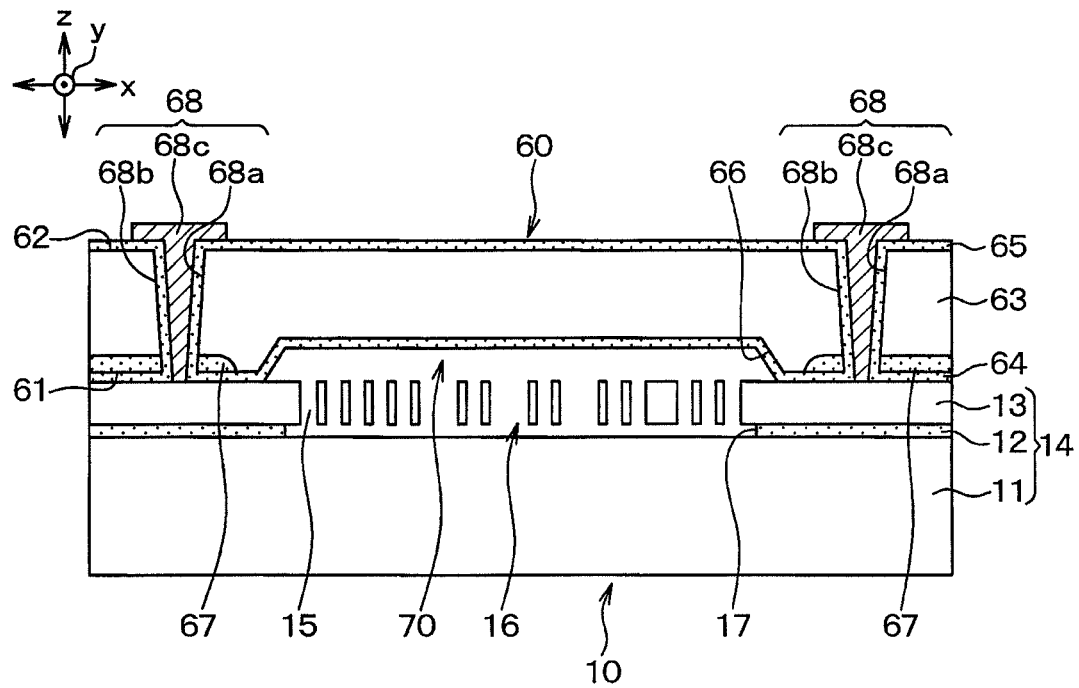
FIG. 20 is a schematic cross-sectional view of a semiconductor device according to another embodiment of the present disclosure.

In the semiconductor devices of the embodiments described above, the through hole 68a has a cylindrical shape. However, the shape of the through hole 68a is not limited to the cylindrical shape. For example, the through hole 68a may have a substantially conical shape, as shown in FIG. 20. As another example, the through hole 68a may have a rectangular column shape or a rectangular conical shape, which have a rectangular shape or a square shape in a cross-section.

In the manufacturing method of the semiconductor device of the first embodiment, the oxide film 80 is formed on the first surface 61 of the semiconductor wafer 63a to restrict the out diffusion and the channeling. Alternatively, the manufacturing method may not have the step of forming the oxide film 80.

Figure 21:
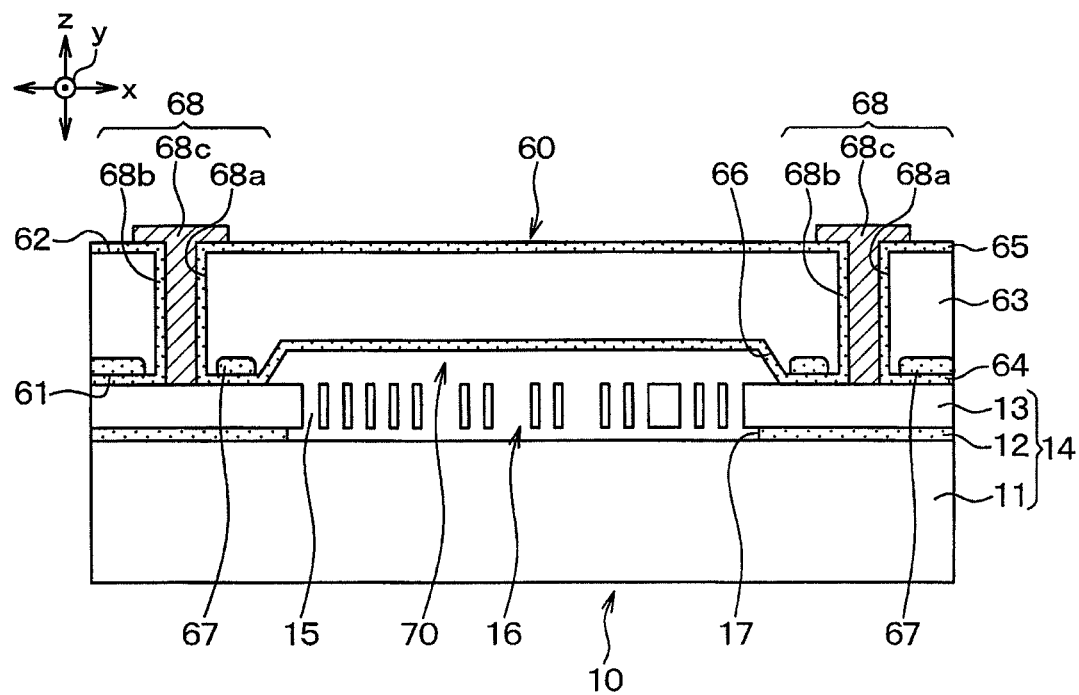
FIG. 21 is a schematic cross-sectional view of a semiconductor device according to further another embodiment of the present disclosure.

Further, in the semiconductor device of the first embodiment, it is not always necessary to have the impurity layer 67 in the region where the through hole 68a is formed. Namely, as shown in FIG. 21, the impurity layer 67 may not be formed in the region where the through hole 68a is formed. In this case, the thickness of the portion of the insulation film 64 formed on the region where the impurity layer 67 is not formed is smaller than the thickness of the portion of the insulation film 64 formed on the region where the impurity layer 67 is formed. However, the portion of the insulation film 64 formed on the region where the impurity layer 67 is not formed is removed when the through hole 68a is formed. Therefore, it is not a matter that the thickness of the portion of the insulation film 64 formed at the region where the impurity layer 67 is not formed has the smaller thickness.

In the semiconductor device of the first embodiment, on the first surface 61 of the semiconductor substrate 63, the peripheral region provided on the periphery of the recessed portion 66 is exemplarily composed of the boundary region 61a and the bonding region 61b. As another example, the peripheral region may further include an intermediate region 61e between the boundary region 61a and the bonding region 61b. Namely, the boundary region 61a is surrounded by the intermediate region 61e, and the intermediate region 61e is surrounded by the bonding region 61b. In other words, the inner end of the bonding region 61b is provided as the intermediate region 61e, and the impurity layer 67 may be disposed only in a region corresponding to the bonding region 61b, in the semiconductor substrate 63.

Figure 22:
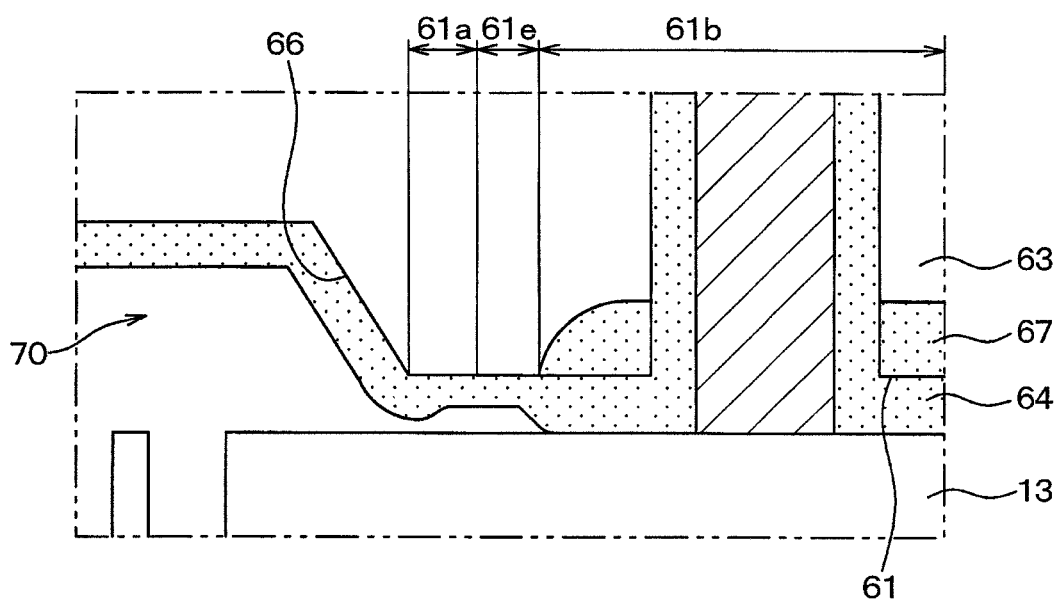
FIG. 22 is an enlarged schematic cross-sectional view of a semiconductor device according to still another embodiment of the present disclosure.

In this case, although the thickness of the portion of the insulation film 64 formed on the intermediate region 61e is smaller than the thickness of the portion of the insulation film 64 formed on the boundary region 61a and the bonding region 61b, the portion of the insulation film 64 formed on the bonding region 61b is bonded to the semiconductor layer 13. Therefore, the advantageous effects similar to the first embodiment described above will be achieved. FIG. 22 is an enlarged schematic cross-sectional view corresponding to the part IV in FIG. 1.

The semiconductor device may be provided by combining the embodiments described above in various ways. For example, the second embodiment may be combined with the sixth embodiment or the seventh embodiment. Namely, the recessed portion 66 having the rectangular frame shape is formed in the semiconductor wafer 63a, and then the insulation film 64 is formed on the first surface 61 of the semiconductor wafer 63a. After the nitride film 110 is formed on the insulation film 64, the nitride film 110 is patterned such that the portion of the insulation film 64 formed on the bonding region 61b and the inner region 61d is exposed. Thereafter, the wet oxidation is performed again. As a result, the thickness of the portion of the insulation film 64 formed on the inner bonding region 61d is increased greater than the thickness of the portions of the insulation film 64 formed on the outer boundary region 61a and the inner boundary region 61c. Also, the thickness of the portion of the insulation film 64 formed on the inner bonding region 61d is the same as the thickness of the portion of the insulation film 64 formed on the outer bonding region 61b.

For example, the third embodiment may be combined with the sixth embodiment or the seventh embodiment. In such a case, the outer boundary region 61a, the inner boundary region 61c and the surface of the recessed portion 66 are exposed from the insulation film 64.

For example, the fourth embodiment may be combined with the sixth embodiment or the seventh embodiment. In such a case, after the outer boundary region 61a, the inner boundary region 61c and the surface of the recessed portion 66 are exposed from the first insulation film 64a, the second insulation film 64b is formed.

For example, the fifth embodiment may be combined with the sixth embodiment or the seventh embodiment. In such a case, after the recessed portion 66 having the rectangular frame shape is formed in the semiconductor wafer 63a, the wet oxidation is performed for 2 hours at 1170° C. As a result, the opening edge of the recessed portion 66 is rounded, and the edge of the end surface of the pillar portion 69 is rounded.

For example, the eighth embodiment may be combined with the sixth embodiment or the seventh embodiment. In such a case, the insulation film 64 is formed on the sensor unit 10.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A semiconductor device comprising:
   a sensor unit including a sensing part adjacent to a surface of the sensor unit, the sensing part outputting a sensor signal according to a physical quantity;
   a semiconductor substrate having a surface opposed to the sensor unit, the semiconductor substrate defining a recessed portion recessed from the surface of the semiconductor substrate at a region opposing to the sensing part; and
   an insulation film disposed between the surface of the sensor unit and the surface of the semiconductor substrate, wherein
   the sensor unit and the semiconductor substrate are stacked such that an air-tight sealed chamber is provided between the sensor unit and the recessed portion of the semiconductor substrate, and the sensing part is disposed in the air-tight sealed chamber;
   the surface of the semiconductor substrate, which is provided on a periphery of the recessed portion, includes a boundary region and a bonding region, the boundary region being at a perimeter of the recessed portion, the bonding region being on a periphery of the boundary region,
   the bonding region has an area greater than an area of the boundary region,
   the insulation film is formed on the surface of the semiconductor substrate,
   the insulation film has a non-uniform thickness such that a thickness of a portion of the insulation film disposed on the bonding region is greater than a thickness of a portion of the insulation film disposed on the boundary region, and
   the portion of the insulation film disposed on the bonding region is bonded to the surface of the sensor unit.

2. A semiconductor device comprising:
   a sensor unit including a sensing part adjacent to a surface of the sensor unit, the sensing part outputting a sensor signal according to a physical quantity;
   a semiconductor substrate having a surface opposed to the sensor unit, the semiconductor substrate defining a recessed portion recessed from the surface of the semiconductor substrate at a region opposing to the sensing part; and
   an insulation film disposed between the surface of the sensor unit and the surface of the semiconductor substrate, wherein
   the sensor unit and the semiconductor substrate are stacked such that an air-tight sealed chamber is provided between the sensor unit and the recessed portion of the semiconductor substrate, and the sensing part is disposed in the air-tight sealed chamber,
   the surface of the semiconductor substrate, which is provided on a periphery of the recessed portion, includes a boundary region and a bonding region, the boundary region being at a perimeter of the recessed portion, the bonding region being on a periphery of the boundary region,
   the bonding region has an area greater than an area of the boundary region,
   the bonding region of the surface of the semiconductor substrate is bonded to the sensor unit through the insulation film, and
   the semiconductor substrate has an impurity layer in a surface layer portion of the semiconductor substrate at a region corresponding to the bonding region, the surface layer portion providing the surface of the semiconductor substrate.

3. The semiconductor device according to claim 1, wherein between the surface of the sensor unit and the surface of the semiconductor substrate, the insulation film is disposed only in a region corresponding to the bonding region of the surface of the semiconductor substrate.

4. The semiconductor device according to claim 1, wherein the boundary region is referred to as an outer boundary region, and the bonding region is referred to as an outer bonding region, the sensor unit includes a bonding portion in the sensing part, the bonding portion being bonded to the insulation film, the recessed portion has a rectangular frame shape, and the semiconductor substrate has a pillar portion located in the rectangular frame shape of the recessed portion to define an inner perimeter of the rectangular frame shape, an end surface of the pillar portion opposed to the sensing part includes an inner boundary region and an inner bonding region, the inner boundary region defining a boundary between the recessed portion and the end surface of the pillar portion, the inner bonding region being in the inner boundary region, the inner bonding region has an area greater than an area of the inner boundary region, the insulation film has a non-uniform thickness such that a thickness of a portion of the insulation film disposed on the inner bonding region is greater than a thickness of a portion of the insulation film disposed on the inner boundary region and a thickness of a portion of the insulation film disposed on the outer boundary region, and the thickness of the portion of the insulation film disposed on the inner bonding region is equal to the thickness of the portion of the insulation film disposed on the outer bonding region, and the portion of the insulation film disposed on the bonding region and the portion of the inner bonding region are bonded to the sensor unit.

5. The semiconductor device according to claim 4, further comprising:

a penetrating electrode passing through the pillar portion and a portion of the insulation film disposed on the end surface of the pillar portion in a stacking direction in which the semiconductor substrate and the sensor unit are stacked, the penetrating electrode being electrically coupled to the sensing part.

* * * * *